United States Patent
Li et al.

(10) Patent No.: US 12,413,249 B2
(45) Date of Patent: Sep. 9, 2025

(54) CODING METHOD, DECODING METHOD, AND COMMUNICATIONS APPARATUS

(71) Applicant: HUAWEI TECHNOLOGIES CO., LTD., Guangdong (CN)

(72) Inventors: Jiahui Li, Shenzhen (CN); Mengyao Ma, Shenzhen (CN); Jiaqi Gu, Shenzhen (CN); Zihan Tang, Shenzhen (CN); Wei Lin, Shenzhen (CN); Huazi Zhang, Hangzhou (CN); Xun Yang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/649,379

(22) Filed: Apr. 29, 2024

(65) Prior Publication Data

US 2024/0283465 A1    Aug. 22, 2024

Related U.S. Application Data

(63) Continuation of application No. PCT/CN2022/123378, filed on Sep. 30, 2022.

(30) Foreign Application Priority Data

Oct. 30, 2021    (CN) ......................... 202111278393.9

(51) Int. Cl.
*H03M 13/13*    (2006.01)
*H03M 13/00*    (2006.01)
(Continued)

(52) U.S. Cl.
CPC ........... *H03M 13/13* (2013.01); *H03M 13/09* (2013.01); *H03M 13/616* (2013.01); *H04J 13/0029* (2013.01)

(58) Field of Classification Search
None
See application file for complete search history.

(56) References Cited

U.S. PATENT DOCUMENTS

| | | | |
|---|---|---|---|
| 2016/0164629 A1* | 6/2016 | Ahn ................... | H04L 1/0041 714/776 |
| 2018/0248567 A1* | 8/2018 | Qu ...................... | H03M 13/11 |

(Continued)

OTHER PUBLICATIONS

H. Saito, "Two-Dimensional Magnetic Recording Systems with CRC-concatenated Polar Channel Coding Schemes," SCC 2019; 12th International ITG Conference on Systems, Communications and Coding, Rostock, Germany, 2019, pp. 1-6, (Year: 2019).*

(Continued)

*Primary Examiner* — Daniel F. McMahon
(74) *Attorney, Agent, or Firm* — Fish & Richardson P.C.

(57) ABSTRACT

This application provides coding/decoding methods and communications apparatuses thereof. In an implementation, a coding method includes: obtaining a first information bit sequence; determining a first frozen bit sequence based on a probability distribution value $P_1$ of the first information bit sequence, determining a check bit sequence based on a second information bit sequence, where the second information bit sequence is the first information bit sequence or a sequence obtained after a pre-transformation operation is performed on the first information bit sequence, obtaining a first bit sequence based on the second information bit sequence, the check bit sequence, and the first frozen bit sequence, where the first bit sequence includes bits in the second information bit sequence.

20 Claims, 6 Drawing Sheets

(51) Int. Cl.
*H03M 13/09* (2006.01)
*H04J 13/00* (2011.01)

(56) References Cited

U.S. PATENT DOCUMENTS

| | | |
|---|---|---|
| 2019/0207709 A1* | 7/2019 | Chen .................... H04L 1/0061 |
| 2019/0260393 A1* | 8/2019 | Nammi ................ H04L 1/0045 |
| 2020/0228145 A1* | 7/2020 | Ahn ...................... H03M 13/09 |
| 2021/0399742 A1* | 12/2021 | Xie ...................... H04L 1/0041 |
| 2022/0263694 A1* | 8/2022 | Iscan .................. H04L 25/0224 |

OTHER PUBLICATIONS

Tal et al., "How to Construct Polar Codes," IEEE Transactions on Information Theory, Oct. 2013, 59(10):6562-6582.

Wu et al., "Construction and Block Error Rate Analysis of Polar Codes Over AWGN Channel Based on Gaussian Approximation," IEEE Communications Letters, Jul. 2014, 18(7):1099-1102.

Honda et al., "Polar Coding Without Alphabet Extension for Asymmetric Models," IEEE Transactions on Information Theory, vol. 59, No. 12, Dec. 2013, pp. 7829-7838.

Zheng et al., "Joint Source-Channel Polar Coding for Biased Bernoulli Sources at Short Blocklengths," Proceedings of 11th International Symposium on Topics in Coding (ISTC), Aug. 30, 2021, pp. 1-5.

Extended European Search Report in European Appln. No. 22885594.6, mailed on Jan. 15, 2025, 12 pages.

* cited by examiner

CODING METHOD, DECODING METHOD, AND COMMUNICATIONS APPARATUS

CROSS-REFERENCE TO RELATED APPLICATIONS

This application is a continuation of International Application No. PCT/CN2022/123378, filed on Sep. 30, 2022, which claims priority to Chinese Patent Application No. 202111278393.9, filed on Oct. 30, 2021. The disclosures of the aforementioned applications are hereby incorporated by reference in their entireties.

TECHNICAL FIELD

This application relates to the field of communications technologies, and in particular, to a coding method, a decoding method, and a communications apparatus.

BACKGROUND

In an existing communications system such as a cellular communications system or a wireless fidelity (wireless-fidelity, WiFi) communications system, based on a separate source-channel coding (SSCC) solution, source coding (compression) processing is first performed on to-be-sent source data, and then channel coding is performed on compressed data, to add specific redundancy to improve reliability of information transmission. The source coding is usually completed at an application layer, and the channel coding is usually completed at a physical layer. For the physical layer, it is assumed that the upper layer has completed ideal source coding and obtained an approximately equiprobable sequence. However, in actual application, some data that is not fully compressed, for example, control information from a link layer or the physical layer, to-be-fed-back channel state information, and some upper-layer application data, may be processed at the physical layer. To fully use source redundancy at the physical layer and improve transmission performance, joint source-channel coding (JSCC) is a potential solution. In this solution, both a source compression operation and a channel protection operation can be completed.

FIG. 1 is a schematic flowchart of a system-polar (polar)-based JSCC solution. A coder side first obtains a to-be-coded bit sequence based on an information bit sequence; and then performs system polar coding on the to-be-coded bit sequence, modulates a bit sequence obtained after the polar coding, and sends the modulated bit sequence to a decoder side. In addition, the coder side sends a probability distribution value (a proportion of 0 or 1 in the information bit sequence) of the information bit sequence to the decoder side by using control signaling. The decoder side decodes a to-be-decoded sequence based on the received probability distribution value and a frozen bit sequence that is all 0s by default. In an existing system-polar-based JSCC solution, during decoding, a transmitting end needs to send control signaling to notify a receiving end of a probability distribution value of a current information bit sequence, causing an increase in control signaling overheads. If a coder side does not send a probability distribution value of an information bit sequence to a decoder side, when decoding a to-be-decoded sequence, the decoder side decodes the to-be-decoded sequence by sequentially trying different probability distribution values and based on a frozen bit sequence that is all 0s by default, causing a high error detection probability. The error detection probability indicates that the decoder side uses an incorrect probability distribution value to try to perform decoding and obtains an incorrect decoding result, but check, for example, cyclic redundancy check (cyclic redundancy check, CRC) or parity check (parity check, PC), on the incorrect decoding result succeeds.

SUMMARY

This application provides a coding method, a decoding method, and a communications apparatus, to help reduce an error detection probability of a decoder side.

According to a first aspect, this application provides a coding method, applied to a first communications device. The method includes: obtaining a first information bit sequence; determining a first frozen bit sequence based on a probability distribution value $P_1$ of the first information bit sequence; determining a check bit sequence based on a second information bit sequence, where the second information bit sequence is the first information bit sequence or a sequence obtained after a pre-transformation operation is performed on the first information bit sequence; obtaining a first bit sequence based on the second information bit sequence, the check bit sequence, and the first frozen bit sequence, where the first bit sequence includes bits in the second information bit sequence, bits in the check bit sequence, and bits in the first frozen bit sequence; performing polar coding on the first bit sequence to obtain a second bit sequence; and outputting the second bit sequence.

Based on the method described in the first aspect, values of the first frozen bit sequence are determined based on the probability distribution value of the first information bit sequence, instead of by setting the values of the first frozen bit sequence to all 0s by default. In this way, when decoding a to-be-decoded sequence, a decoder side may sequentially try different probability distribution values in a probability distribution value set and frozen bit sequences corresponding to the probability distribution values to perform decoding, so that the decoder side can better distinguish between different probability distribution values, thereby reducing an error detection probability.

In addition, in this application, the first communications device may first perform the pre-transformation operation on the first information bit sequence, and then determine the check bit sequence based on the second information bit sequence obtained after the pre-transformation operation. In this way, the decoder side needs to perform a polar operation only on a third information bit sequence that is obtained through decoding and that is successfully checked, to obtain the first information bit sequence sent by the first communications device. This helps reduce power consumption of the decoder side and improve decoding efficiency. If the first communications device first determines the check bit sequence based on the first information bit sequence, and then performs the pre-transformation operation on the first information bit sequence, the decoder side needs to perform a polar operation on a third information bit sequence obtained through decoding based on each probability distribution value, and then check (for example, perform CRC or PC on) an information bit sequence obtained after the polar operation. In this way, power consumption of the decoder side is relatively high and decoding efficiency is low.

In addition, in this application, the first communications device may directly determine the check bit sequence based on the first information bit sequence, that is, the first communications device may not perform the pre-transformation operation on the first information bit sequence. In this way, the decoder side does not need to perform a polar operation on a third information bit sequence obtained through decoding, and the decoder side may directly determine the third information bit sequence as the first information bit sequence, thereby reducing processing overheads of the first communications device and the decoder side.

In a possible implementation, if the probability distribution value $P_1$ is not equiprobable distribution, the second information bit sequence is the sequence obtained after the pre-transformation operation is performed on the first information bit sequence; or if the probability distribution value $P_1$ is equiprobable distribution, the second information bit sequence is the first information bit sequence. Based on this possible implementation, two implementations in which the pre-transformation operation is performed on the first information bit sequence and the pre-transformation operation is not performed on the first information bit sequence may be properly compatible in a system. When the pre-transformation operation is performed on the first information bit sequence, decoding performance is improved by using sparseness of the first information bit sequence. When the probability distribution value of the first information bit sequence is far away from equiprobable distribution, it indicates that the first information bit sequence is very sparse. When the probability distribution value of the first information bit sequence is equiprobable distribution, it indicates that the first information bit sequence is not sparse. Therefore, when the probability distribution value of the first information bit sequence is equiprobable distribution, the pre-transformation operation does not need to be performed on the first information bit sequence, to reduce processing overheads of the first communications device and the decoder side.

In a possible implementation, if $|P_1-0.5|\leq\in$, the probability distribution value $P_1$ is equiprobable distribution, where $\in$ is a preset value. $\in$ may be a relatively small value, for example, may be 0.001, 0.01, 0.02, 0.03, 0.04, or 0.05.

In a possible implementation, check bit locations in the first bit sequence are bit locations corresponding to rows whose sums are 1 in G(a), G(a) is a matrix including rows and columns in a set a in a polar matrix G, the polar matrix G is a polar matrix used for the polar coding, the set a is an information bit set, and the information bit set includes information bit locations and the check bit locations in the first bit sequence. Based on this possible implementation, on a coder side, the pre-transformation operation of the first information bit sequence may be decoupled from the operation of determining the check bit sequence based on the second information bit sequence, so that the pre-transformation operation can be performed before the check bit sequence is determined, to reduce power consumption of the decoder side and improve decoding efficiency.

In a possible implementation, at least one check bit in the check bit sequence is located in the bits included in the second information bit sequence. In this way, the at least one check bit may be used to check an information bit located in front of the at least one check bit. This helps implement a function of early decoding stopping. The early decoding stopping means that when the decoder side decodes some information bits in a to-be-decoded sequence, the decoder side may check the decoded information bits by using check bits, and if the check on the information bits fails, the decoder side stops decoding in advance, thereby reducing power consumption of the decoder side.

In a possible implementation, a decoding order of at least one check bit in the check bit sequence is located in a decoding order of the bits included in the second information bit sequence. In this way, the at least one check bit may be used to check an information bit in front of the decoding order of the at least one check bit, to implement a function of early decoding stopping, thereby reducing power consumption of the decoder side.

In a possible implementation, the determining a first frozen bit sequence based on a probability distribution value $P_1$ of the first information bit sequence includes: selecting a probability distribution value $P_0$ in a probability distribution value set P based on the probability distribution value $P_1$ of the first information bit sequence, where the probability distribution value $P_0$ is a probability distribution value closest to the probability distribution value $P_1$ in the probability distribution value set P, and one probability distribution value in the probability distribution value set P corresponds to one frozen bit sequence mapping manner; and determining the first frozen bit sequence based on a frozen bit sequence mapping manner corresponding to the probability distribution value $P_0$. Based on this possible implementation, different probability distribution values in the probability distribution value set P may correspond to different frozen bit sequence mapping manners. In this way, when the decoder side sequentially tries different probability distribution values in the probability distribution value set and frozen bit sequences corresponding to the probability distribution values to perform decoding, the decoder side can better distinguish between different probability distribution values, thereby reducing an error detection probability.

In a possible implementation, the first frozen bit sequence is determined based on a basic sequence corresponding to the probability distribution value $P_0$, and the basic sequence is determined based on a quantity of probability distribution values included in the probability distribution value set P. In this way, the coder/decoder side needs to store only basic sequences and relationships between first frozen bit sequences and the basic sequences, to help reduce storage overheads, and also ensure that different first frozen bit sequences are orthogonal to a specific extent, thereby reducing an error detection probability.

In a possible implementation, the first frozen bit sequence is determined based on an m-sequence, a Gold sequence, or a pseudo-random sequence corresponding to the probability distribution value $P_0$. In this way, the coder/decoder side needs to store only mapping relationships between first frozen bit sequences and m-sequences, Gold sequences, or pseudo-random sequences, to help reduce storage overheads, and also ensure that different first frozen bit sequences are orthogonal to a specific extent, thereby reducing an error detection probability.

In a possible implementation, a probability distribution reference value range or a probability distribution reference value is sent to a second communications device every N information bit sequences, where N is an integer greater than 1. The probability distribution reference value range or the probability distribution reference value is sent to the second communications device once every N information bit sequences. In this way, the decoder side may preferentially select a probability distribution value corresponding to the probability distribution reference value range or the probability distribution reference value from the probability distribution value set to perform decoding, to help reduce a quantity of times the decoder side tries to perform decoding, and reduce decoding power consumption.

In a possible implementation, the check bits include cyclic redundancy check CRC bits and/or parity check PC bits.

According to a second aspect, this application provides a decoding method, applied to a second communications device. The method includes:

step 1: obtaining a to-be-decoded sequence;
step 2: setting i=1;
step 3: decoding the to-be-decoded sequence based on an $i^{th}$ probability distribution value in a probability distribution value set P and a frozen bit sequence corresponding to the $i^{th}$ probability distribution value, to obtain a third bit sequence corresponding to the $i^{th}$ probability distribution value, where the third bit sequence includes bits in a third information bit sequence, check bits, and bits in the frozen bit sequence corresponding to the $i^{th}$ probability distribution value;
step 4: checking the third information bit sequence;
step 5: if the check on the third information bit sequence succeeds, obtaining a first information bit sequence based on the third information bit sequence, and stopping decoding, where the first information bit sequence is the third information bit sequence or the first information bit sequence is a sequence obtained after polar coding is performed on the third information bit sequence;
step 6: if the check on the third information bit sequence fails and i is less than x, setting i=i+1, and returning to step 3, where x is a quantity of probability distribution values included in the probability distribution value set P; and
step 7: if the check on the third information bit sequence fails and i is equal to x: stopping decoding; or obtaining a fourth information bit sequence based on a target information bit sequence, and stopping decoding, where the target information bit sequence is one of x third information bit sequences corresponding to the probability distribution value set P, and the fourth information bit sequence is the target information bit sequence or a sequence obtained after polar coding is performed on the target information bit sequence.

Based on the method described in the second aspect, when decoding a to-be-decoded sequence, a decoder side may sequentially try different probability distribution values in a probability distribution value set and frozen bit sequences corresponding to the probability distribution values to perform decoding, so that the decoder side can better distinguish between different probability distribution values, thereby reducing an error detection probability.

In addition, in this application, the decoder side may need to perform a polar operation only on a third information bit sequence that is obtained through decoding and that is successfully checked, to obtain the first information bit sequence sent by a first communications device. This helps reduce power consumption of the decoder side and improve decoding efficiency. Alternatively, in this application, the second communications device may directly determine the third information bit sequence as the first information bit sequence, that is, the second communications device may not perform polar coding on the third information bit sequence to obtain the first information bit sequence. In this way, processing overheads of the second communications device can be reduced.

In a possible implementation, if the $i^{th}$ probability distribution value is not equiprobable distribution, the first information bit sequence is the sequence obtained after polar coding is performed on the third information bit sequence; or if the $i^{th}$ probability distribution value is equiprobable distribution, the first information bit sequence is the third information bit sequence. Based on this possible implementation, two implementations in which the third information bit sequence is determined as the first information bit sequence and the sequence obtained after polar coding is performed on the third information bit sequence is determined as the first information bit sequence may be properly compatible in a system.

In a possible implementation, if $|P_{i,r}-0.5|\leq \epsilon$, the $i^{th}$ probability distribution value is equiprobable distribution, where $\epsilon$ is a preset value, and $P_{i,r}$ is the $i^{th}$ probability distribution value. $\epsilon$ may be a relatively small value, for example, may be 0.001, 0.01, 0.02, 0.03, 0.04, or 0.05.

In a possible implementation, a decoding order of probability distribution values in the probability distribution value set P is determined based on information entropies corresponding to the probability distribution values in the probability distribution value set. A probability distribution value with a larger information entropy indicates lower sparsity, and a probability distribution value with a smaller information entropy indicates higher sparsity. Two probability distribution values whose sum is 1 (for example, P'+P''=1) are equal in information entropy and consistent in sparsity. The decoding order of the probability distribution values in the probability distribution value set P is determined based on the information entropies corresponding to the probability distribution values in the probability distribution value set, thereby helping reduce an error detection probability.

In a possible implementation, an information entropy corresponding to the $i^{th}$ probability distribution value is greater than or equal to an information entropy corresponding to an $(i+1)^{th}$ probability distribution value. That is, the second communications device may preferentially use a probability distribution value with a relatively large information entropy to perform decoding. Because a probability distribution value with a relatively large information entropy has less prior information that can be used by the decoder side, the probability distribution value is preferentially tried, so that negative impact caused on a decoding effect by the decoder side by introducing incorrect prior information can be reduced, thereby reducing an error detection probability.

In a possible implementation, a decoding order of probability distribution values in the probability distribution value set P is determined based on historical probability distribution values of a transmitting end. This possible implementation helps reduce a quantity of times the decoder side tries to perform decoding, and reduce decoding power consumption.

In a possible implementation, a probability distribution reference value range or a probability distribution reference value sent by the first communications device every N information bit sequences is received, where N is an integer greater than 1. A decoding order of probability distribution values in the probability distribution value set P is determined based on the probability distribution reference value range or the probability distribution reference value. This possible implementation helps reduce a quantity of times the decoder side tries to perform decoding, and reduce decoding power consumption.

In a possible implementation, the target information bit sequence is a third information bit sequence corresponding to equiprobable distribution in the probability distribution value set P. Because the second communications device does not know a real probability distribution value, when check on the third information bit sequences corresponding to all the probability distribution values fails, it is a conservative solution to obtain the fourth information bit sequence based on the third information bit sequence corresponding to equiprobable distribution, so that a negative effect caused by incorrectly using a probability distribution value can be avoided.

In a possible implementation, check bit locations in the third bit sequence are bit locations corresponding to rows whose sums are 1 in G(a), G(a) is a matrix including rows and columns in a set a in a polar matrix G, the polar matrix G is a polar matrix used for the polar coding, the set a is an information bit set, and the information bit set includes information bit locations and the check bit locations in the third bit sequence. Based on this possible implementation, on a coder side, a pre-transformation operation of the first information bit sequence may be decoupled from an operation of determining a check bit sequence based on a second information bit sequence, so that the pre-transformation operation can be performed before the check bit sequence is determined. In this way, the decoder side needs to perform a polar operation only on a third information bit sequence that is obtained through decoding and that is successfully checked, to obtain the first information bit sequence sent by the coder side, to reduce power consumption of the decoder side and improve decoding efficiency.

In a possible implementation, at least one of the check bits is located in the bits included in the third information bit sequence. In this way, the at least one check bit may be used to check an information bit located in front of the at least one check bit. This helps implement a function of early decoding stopping. The early decoding stopping means that when the decoder side decodes some information bits in a to-be-decoded sequence, the decoder side may check the decoded information bits by using check bits, and if the check on the information bits fails, the decoder side stops decoding in advance, thereby reducing decoding power consumption.

In a possible implementation, a decoding order of at least one of the check bits is located in a decoding order of the bits included in the third information bit sequence. In this way, the at least one check bit may be used to check an information bit in front of the decoding order of the at least one check bit, to implement a function of early decoding stopping.

In a possible implementation, one probability distribution value in the probability distribution value set P corresponds to one frozen bit sequence mapping manner, and the second communications device may further determine, based on a frozen bit sequence mapping manner corresponding to the $i^{th}$ probability distribution value, the frozen bit sequence corresponding to the $i^{th}$ probability distribution value. Based on this possible implementation, different probability distribution values in the probability distribution value set P may correspond to different frozen bit sequence mapping manners. In this way, when the decoder side sequentially tries different probability distribution values in the probability distribution value set and frozen bit sequences corresponding to the probability distribution values to perform decoding, the decoder side can better distinguish between different probability distribution values, thereby reducing an error detection probability.

In a possible implementation, the frozen bit sequence corresponding to the $i^{th}$ probability distribution value is determined based on a basic sequence corresponding to the probability distribution value, and the basic sequence is determined based on the quantity of probability distribution values included in the probability distribution value set P.

In a possible implementation, the frozen bit sequence corresponding to the $i^{th}$ probability distribution value is determined based on an m-sequence, a Gold sequence, or a pseudo-random sequence corresponding to the probability distribution value.

In a possible implementation, the check bits include cyclic redundancy check CRC bits and/or parity check PC bits.

According to a third aspect, this application provides a communications apparatus. The communications apparatus includes: a processing unit, configured to obtain a first information bit sequence; further configured to determine a first frozen bit sequence based on a probability distribution value $P_1$ of the first information bit sequence; further configured to determine a check bit sequence based on a second information bit sequence, where the second information bit sequence is the first information bit sequence or a sequence obtained after a pre-transformation operation is performed on the first information bit sequence; further configured to obtain a first bit sequence based on the second information bit sequence, the check bit sequence, and the first frozen bit sequence, where the first bit sequence includes bits in the second information bit sequence, bits in the check bit sequence, and bits in the first frozen bit sequence; further configured to perform polar coding on the first bit sequence to obtain a second bit sequence; and further configured to output the second bit sequence.

In a possible implementation, if the probability distribution value $P_1$ is not equiprobable distribution, the second information bit sequence is the sequence obtained after the pre-transformation operation is performed on the first information bit sequence; or if the probability distribution value $P_1$ is equiprobable distribution, the second information bit sequence is the first information bit sequence.

In a possible implementation, if $|P_1-0.5| \le \epsilon$, the probability distribution value $P_1$ is equiprobable distribution, where $\epsilon$ is a preset value. $\epsilon$ may be a relatively small value, for example, may be 0.001, 0.01, 0.02, 0.03, 0.04, or 0.05.

In a possible implementation, check bit locations in the first bit sequence are bit locations corresponding to rows whose sums are 1 in G(a), G(a) is a matrix including rows and columns in a set a in a polar matrix G, the polar matrix G is a polar matrix used for the polar coding, the set a is an information bit set, and the information bit set includes information bit locations and the check bit locations in the first bit sequence.

In a possible implementation, at least one check bit in the check bit sequence is located in the bits included in the second information bit sequence.

In a possible implementation, a manner in which the processing unit determines the first frozen bit sequence based on the probability distribution value $P_1$ of the first information bit sequence is specifically: selecting a probability distribution value $P_0$ in a probability distribution value set P based on the probability distribution value $P_1$ of the first information bit sequence, where the probability distribution value $P_0$ is a probability distribution value closest to the probability distribution value $P_1$ in the probability distribution value set P, and one probability distribution value in the probability distribution value set P corresponds to one frozen bit sequence mapping manner; and determining the first frozen bit sequence based on a frozen bit sequence mapping manner corresponding to the probability distribution value $P_0$.

In a possible implementation, the first frozen bit sequence is determined based on a basic sequence corresponding to the probability distribution value $P_0$, and the basic sequence is determined based on a quantity of probability distribution values included in the probability distribution value set P.

In a possible implementation, the first frozen bit sequence is determined based on an m-sequence, a Gold sequence, or a pseudo-random sequence corresponding to the probability distribution value $P_0$.

In a possible implementation, the communications apparatus further includes a communications unit. The communications unit is configured to send a probability distribution reference value range or a probability distribution reference value to a second communications device every N information bit sequences, where N is an integer greater than 1.

In a possible implementation, the check bits include cyclic redundancy check CRC bits and/or parity check PC bits.

According to a fourth aspect, this application provides a communications apparatus. The communications apparatus includes:

a processing unit, configured to obtain a to-be-decoded sequence, where the processing unit is further configured to set i=1;

the processing unit is further configured to decode the to-be-decoded sequence based on an $i^{th}$ probability distribution value in a probability distribution value set P and a frozen bit sequence corresponding to the $i^{th}$ probability distribution value, to obtain a third bit sequence corresponding to the $i^{th}$ probability distribution value, where the third bit sequence includes bits in a third information bit sequence, check bits, and bits in the frozen bit sequence corresponding to the $i^{th}$ probability distribution value;

the processing unit is further configured to check the third information bit sequence;

the processing unit is further configured to: if the check on the third information bit sequence succeeds, obtain a first information bit sequence based on the third information bit sequence, and stop decoding, where the first information bit sequence is the third information bit sequence or the first information bit sequence is a sequence obtained after polar coding is performed on the third information bit sequence;

the processing unit is further configured to: if the check on the third information bit sequence fails and i is less than x, set i=i+1, and perform the step of decoding the to-be-decoded sequence based on an $i^{th}$ probability distribution value in a probability distribution value set P and a frozen bit sequence corresponding to the $i^{th}$ probability distribution value, to obtain a third bit sequence corresponding to the $i^{th}$ probability distribution value, where x is a quantity of probability distribution values included in the probability distribution value set P; and the processing unit is further configured to: if the check on the third information bit sequence fails and i is equal to x: stop decoding; or obtain a fourth information bit sequence based on a target information bit sequence, and stop decoding, where the target information bit sequence is one of x third information bit sequences corresponding to the probability distribution value set P, and the fourth information bit sequence is the target information bit sequence or the fourth information bit sequence is a sequence obtained after polar coding is performed on the target information bit sequence.

In a possible implementation, if the $i^{th}$ probability distribution value is not equiprobable distribution, the first information bit sequence is the sequence obtained after polar coding is performed on the third information bit sequence; or if the $i^{th}$ probability distribution value is equiprobable distribution, the first information bit sequence is the third information bit sequence.

In a possible implementation, if $|P_{i,r}-0.5|\le\epsilon$, the $i^{th}$ probability distribution value is equiprobable distribution, where $\epsilon$ is a preset value, and $P_{i,r}$ is the $i^{th}$ probability distribution value. $\epsilon$ may be a relatively small value, for example, may be 0.001, 0.01, 0.02, 0.03, 0.04, or 0.05.

In a possible implementation, a decoding order of probability distribution values in the probability distribution value set P is determined based on information entropies corresponding to the probability distribution values in the probability distribution value set P.

In a possible implementation, an information entropy corresponding to the $i^{th}$ probability distribution value is greater than or equal to an information entropy corresponding to an $(i+1)^{th}$ probability distribution value.

In a possible implementation, a decoding order of probability distribution values in the probability distribution value set P is determined based on historical probability distribution values of a transmitting end.

In a possible implementation, the communications apparatus further includes a communications unit. The communications unit is configured to receive a probability distribution reference value range or a probability distribution reference value sent by a first communications device every N information bit sequences, where N is an integer greater than 1. A decoding order of probability distribution values in the probability distribution value set P is determined based on the probability distribution reference value range or the probability distribution reference value.

In a possible implementation, the target information bit sequence is a third information bit sequence corresponding to equiprobable distribution in the probability distribution value set P.

In a possible implementation, check bit locations in the third bit sequence are bit locations corresponding to rows whose sums are 1 in G(a), G(a) is a matrix including rows and columns in a set a in a polar matrix G, the polar matrix G is a polar matrix used for the polar coding, the set a is an information bit set, and the information bit set includes information bit locations and the check bit locations in the third bit sequence.

In a possible implementation, at least one of the check bits is located in the bits included in the third information bit sequence.

In a possible implementation, one probability distribution value in the probability distribution value set P corresponds to one frozen bit sequence mapping manner, and the processing unit is further configured to determine, based on a frozen bit sequence mapping manner corresponding to the $i^{th}$ probability distribution value, the frozen bit sequence corresponding to the $i^{th}$ probability distribution value.

In a possible implementation, the frozen bit sequence corresponding to the $i^{th}$ probability distribution value is determined based on a basic sequence corresponding to the probability distribution value, and the basic sequence is determined based on the quantity of probability distribution values included in the probability distribution value set P.

In a possible implementation, the frozen bit sequence corresponding to the $i^{th}$ probability distribution value is determined based on an m-sequence, a Gold sequence, or a pseudo-random sequence corresponding to the probability distribution value.

In a possible implementation, the check bits include cyclic redundancy check CRC bits and/or parity check PC bits.

According to a fifth aspect, this application provides a communications apparatus. The communications apparatus includes a processor, and when the processor invokes a computer program in a memory, the method according to the first aspect or the second aspect is performed.

According to a sixth aspect, this application provides a communications apparatus. The communications apparatus includes a processor and a memory, the processor is coupled to the memory, and the processor is configured to implement the method according to the first aspect or the second aspect.

According to a seventh aspect, this application provides a communications apparatus. The communications apparatus includes a processor, a memory, and a transceiver, the processor is coupled to the memory, the transceiver is configured to send/receive data, and the processor is configured to implement the method according to the first aspect or the second aspect.

According to an eighth aspect, this application provides a communications apparatus. The communications apparatus includes a processor and an interface, the interface is configured to receive or output a signal, and the processor is configured to implement the method according to the first aspect or the second aspect by using a logic circuit or by executing code instructions.

According to a ninth aspect, this application provides a computer-readable storage medium. The storage medium stores a computer program or instructions, and when the computer program is or the instructions are executed by a communications apparatus, the method according to the first aspect or the second aspect is implemented.

According to a tenth aspect, this application provides a computer program product including instructions. When a computer reads and executes the computer program product, the computer is enabled to perform the method according to the first aspect or the second aspect.

DESCRIPTION OF EMBODIMENTS

The terms "first", "second", and the like in the specification, claims, and accompanying drawings of this application are used to distinguish between different objects, but are not used to describe a specific order. In addition, the terms "include" and "have" and any other variants thereof are intended to cover a non-exclusive inclusion. For example, a process, a method, a system, a product, or a device that includes a series of steps or units is not limited to the listed steps or units, but optionally further includes an unlisted step or unit, or optionally further includes another inherent step or unit of the process, the method, the system, the product, or the device.

To better understand this application, the following describes a communications system provided in embodiments of this application.

Figure 1:
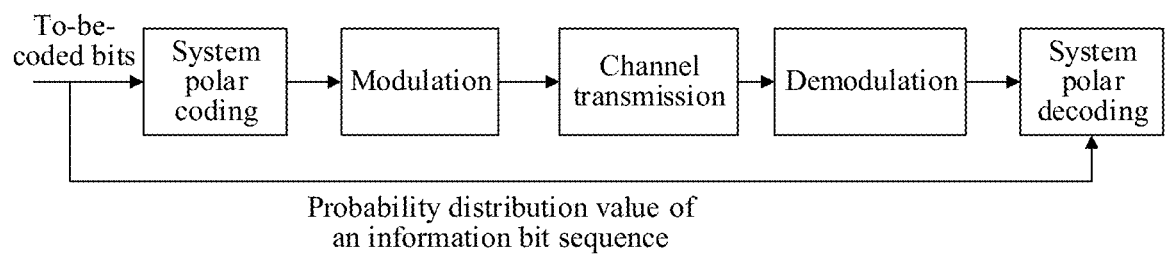
FIG. 1 is a schematic flowchart of an existing coding and decoding method.
Figure 2:
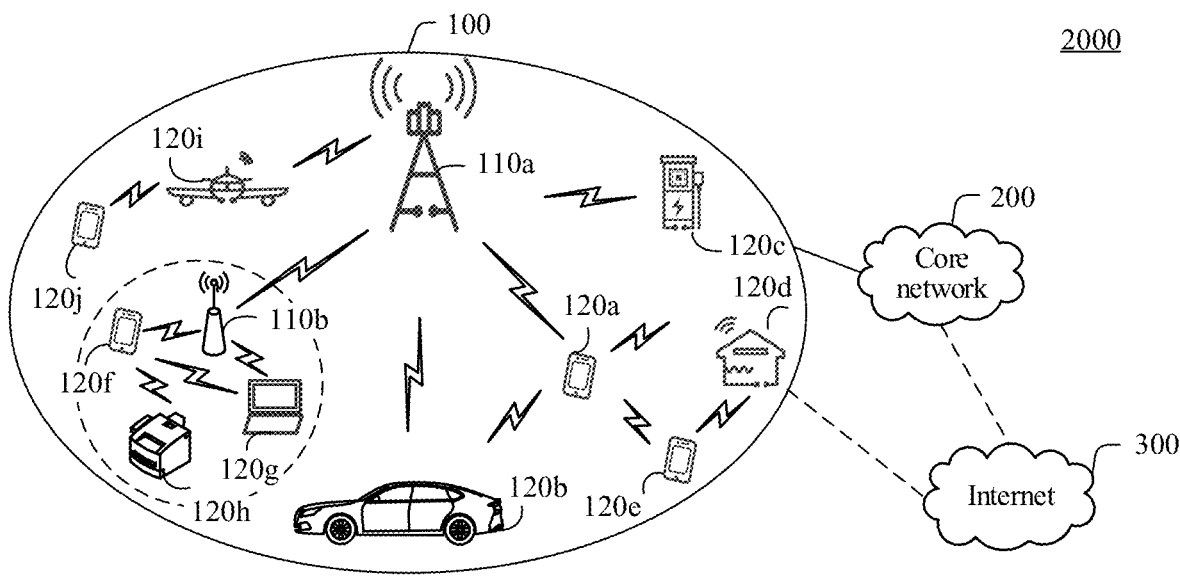
FIG. 2 is a schematic diagram of a communications system according to an embodiment of this application.

FIG. 2 is a schematic diagram of a communications system 2000 to which embodiments of this application are applied. As shown in FIG. 2, the communications system 2000 includes a radio access network 100 and a core network 200. Optionally, the communications system 2000 may further include an Internet 300. The radio access network 100 may include at least one radio access network device (for example, 110a and 110b in FIG. 2), and may further include at least one terminal device (for example, 120a to 120j in FIG. 2). The terminal device is connected to the radio access network device in a wireless manner, and the radio access network device is connected to the core network in a wireless or wired manner. A core network device and the radio access network device may be different independent physical devices, or functions of the core network device and logical functions of the radio access network device may be integrated into a same physical device, or some functions of the core network device and some functions of the radio access network device may be integrated into one physical device. Terminal devices may be connected to each other in a wired or wireless manner, and radio access network devices may be connected to each other in a wired or wireless manner. FIG. 2 is merely a schematic diagram, and the communications system may further include other network devices, for example, may further include a wireless relay device and a wireless backhaul device that are not drawn in FIG. 2.

The radio access network device may be a base station (base station), an evolved NodeB (evolved NodeB, eNodeB), a transmission reception point (transmission reception point, TRP), a next generation NodeB (next generation NodeB, gNB) in a 5th generation (5th generation, 5G) mobile communications system, a next generation base station in a 6th generation (6th generation, 6G) mobile communications system, a base station in a future mobile communications system, an access node in a WiFi system, or the like, or may be a module or a unit that completes some functions of the base station, for example, may be a central unit (central unit, CU), or may be a distributed unit (distributed unit, DU). The CU herein completes functions of a radio resource control protocol and a packet data convergence protocol (packet data convergence protocol, PDCP) of the base station, and may further complete functions of a service data adaptation protocol (service data adaptation protocol, SDAP). The DU completes functions of a radio link control layer and a medium access control (medium access control, MAC) layer of the base station, and may further complete some or all of functions of a physical layer. For specific descriptions of the foregoing protocol layers, refer to related technical specifications of the 3rd generation partnership project (3rd generation partnership project, 3GPP). The radio access network device may be a macro base station (for example, 110a in FIG. 2), may be a micro base station or an indoor station (for example, 110b in FIG. 2), or may be a relay node, a donor node, or the like. A specific technology and a specific device form that are used by the radio access network device are not limited in embodiments of this application. In embodiments of this application, the radio access network device may be referred to as a network device for short. For ease of description, the radio access network device is referred to as a network device for short below for description.

The terminal device may also be referred to as a terminal, user equipment (user equipment, UE), a mobile station, a mobile terminal, or the like. The terminal device may be widely used in various scenarios, for example, a device-to-device (device-to-device, D2D) scenario, a vehicle-to-everything (vehicle to everything, V2X) communication scenario, a machine type communication (machine-type communication, MTC) scenario, an internet of things (internet of things, IOT) scenario, a virtual reality scenario, an augmented reality scenario, an industrial control scenario, a self-driving scenario, a telemedicine scenario, a smart grid scenario, a smart furniture scenario, a smart office scenario, a smart wearable scenario, a smart transportation scenario, and a smart city scenario. The terminal may be a mobile phone, a tablet computer, a computer with a wireless sending/receiving function, a wearable device, a vehicle, an unmanned aerial vehicle, a helicopter, an airplane, a ship, a robot, a robot arm, a smart home device, or the like. A specific technology and a specific device form that are used by the terminal device are not limited in embodiments of this application.

The network device and the terminal device may be at fixed locations, or may be movable. The network device and the terminal device each may be deployed on the land, including an indoor device, an outdoor device, a handheld device, or a vehicle-mounted device, may be deployed on a water surface, or may be deployed on an airplane, a balloon, and a satellite in the air. An application scenario of the network device and the terminal device is not limited in embodiments of this application.

Roles of the network device and the terminal device may be relative. For example, the helicopter or the unmanned aerial vehicle $120i$ in FIG. 2 may be configured as a mobile network device. For the terminal device $120j$ that accesses the radio access network 100 through $120i$, the terminal device $120i$ is a network device. However, for the network device $110a$, $120i$ is a terminal device, that is, $110a$ and $120i$ communicate with each other by using a radio air interface protocol. Certainly, $110a$ and $120i$ may alternatively communicate with each other by using an interface protocol between network devices. In this case, compared with $110a$, $120i$ is also a network device. Therefore, both the network device and the terminal device may be collectively referred to as communications apparatuses. $110a$ and $110b$ in FIG. 2 each may be referred to as a communications apparatus having functions of a network device, and $120a$ to $120j$ in FIG. 2 each may be referred to as a communications apparatus having functions of a terminal device.

Communication may be performed between a network device and a terminal device, between network devices, or between terminal devices by using a licensed spectrum, an unlicensed spectrum, or both a licensed spectrum and an unlicensed spectrum, may be performed by using a spectrum below 6 gigahertz (gigahertz, GHz), a spectrum above 6 GHz, or both a spectrum below 6 GHz and a spectrum above 6 GHz. A spectrum resource used for wireless communication is not limited in embodiments of this application.

In this embodiment of this application, the function of the network device may alternatively be performed by a module (for example, a chip) in the network device, or may be performed by a control subsystem including the function of the network device. Herein, the control subsystem including the function of the network device may be a control center in the foregoing application scenario such as the smart grid scenario, the industrial control scenario, the intelligent transportation scenario, or the smart city scenario. The function of the terminal device may alternatively be performed by a module (for example, a chip or a modem) in the terminal device, or may be performed by an apparatus including the function of the terminal device.

In embodiments of this application, a first communications device on a coder side may be a terminal device, and a second communications device on a decoder side may be a network device. Alternatively, a first communications device on a coder side may be a network device, and a second communications device on a decoder side may be a terminal device.

The following describes some nouns or terms used in embodiments of this application.

1. Probability Distribution Value

A probability distribution value of an information bit sequence is a proportion of 0 or 1 in the information bit sequence. For example, the probability distribution value is a proportion of 1 in the information bit sequence. Assuming that the information bit sequence is 0000000011, the probability distribution value of the information bit sequence is 0.2.

2. Log Likelihood Ratio (Log Likelihood Ratio, LLR)

A log likelihood ratio of a bit is a natural logarithm of a ratio of a probability that the bit is 1 to a probability that the bit is 0. If the probability that the bit is 1 is denoted as $P(1)$, and the probability that the bit is 0 is denoted as $P(0)$, the log likelihood ratio of the bit is $\ln[P(0)/P(1)]$.

3. Coding Length

The coding length is a quantity of bits in a coded bit sequence. When a quantity of information bits is fixed, if coding is performed in a coding manner with a longer coding length, there are more redundant bits in a coded bit sequence, and data transmission reliability is higher.

4. Coding Rate

The coding rate is a proportion of information bits existing before coding in coded bits. If a bit sequence is coded in a coding manner with a lower coding rate, there are more redundant bits in a coded bit sequence, and data transmission reliability is higher.

5. Pseudo-Random Sequence

A sequence that can be determined in advance and can be repeatedly implemented is referred to as a determined sequence, a sequence that can be neither determined in advance nor repeatedly implemented is referred to as a random sequence, and a sequence that cannot be determined in advance but can be repeatedly generated is referred to as a pseudo-random sequence.

6. m-Sequence

The m-sequence is short for a longest linear shift register sequence, and is a pseudo-random sequence, a pseudo-noise (PN) code, or a pseudo-random code. In all pseudo-random sequences, the m-sequence is a most important and basic pseudo-random sequence.

7. Gold (Gold) Sequence

The Gold sequence is a sequence generated by performing modulo 2 addition on a pair of preferred m-sequences, and the pair of preferred m-sequences cause relatively small cross-correlation between different Gold sequences.

The following further describes in detail a coding method, a decoding method, and a communications apparatus provided in embodiments of this application.

Figure 3:
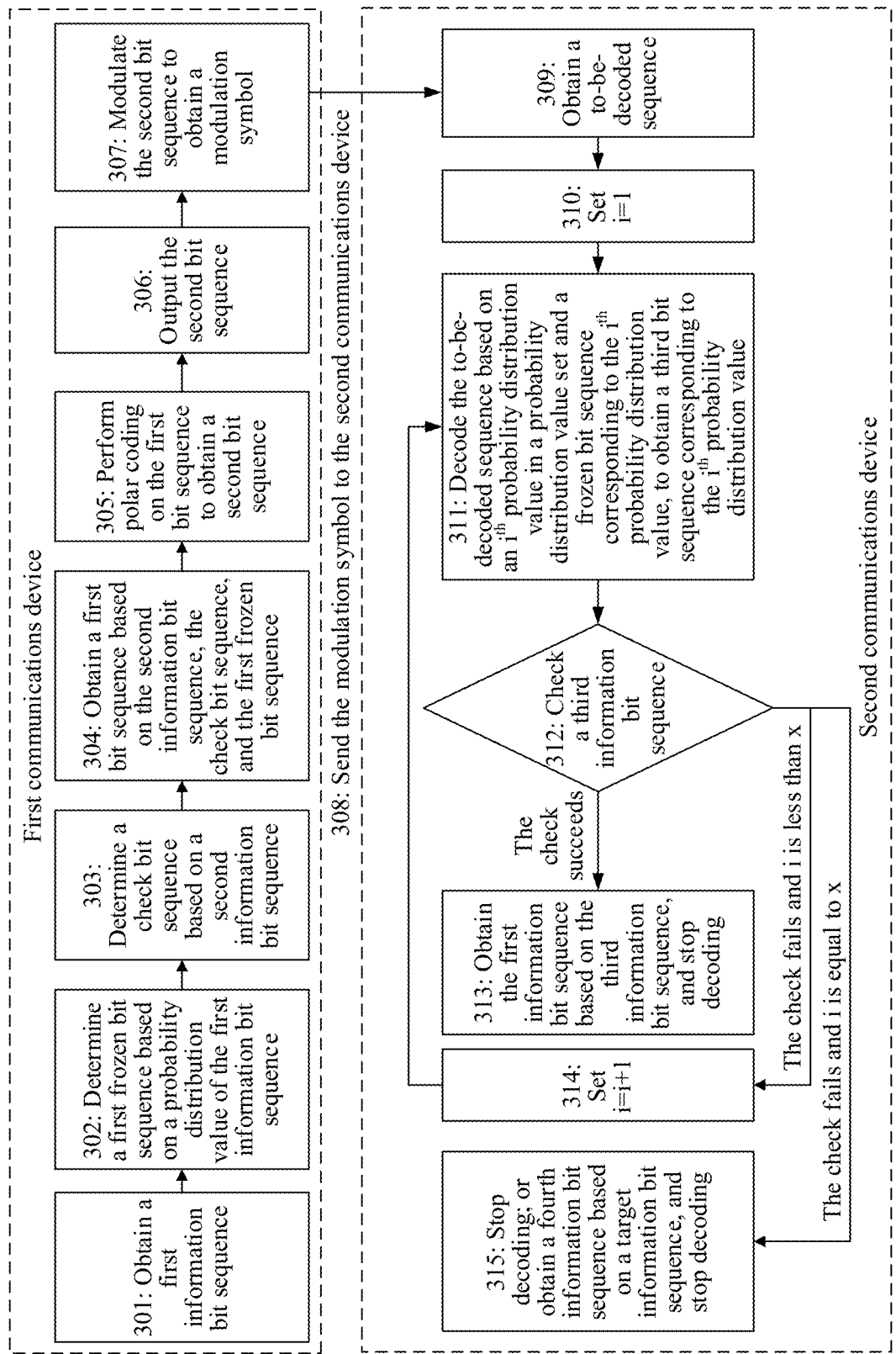
FIG. 3 is a schematic flowchart of a coding and decoding method according to an embodiment of this application.

FIG. 3 is a schematic flowchart of a coding and decoding method according to an embodiment of this application. As shown in FIG. 3, the coding and decoding method includes the following step 301 to step 315. The method shown in FIG. 3 may be performed by a first communications device and a second communications device. Alternatively, the method shown in FIG. 3 may be performed by a chip in the first communications device and a chip in the second communications device. FIG. 3 is described by using an example in which the first communications device and the second communications device perform the method.

301: The first communications device obtains a first information bit sequence.

302: The first communications device determines a first frozen bit sequence based on a probability distribution value $P_1$ of the first information bit sequence.

In this embodiment of this application, that the first communications device determines a first frozen bit sequence based on a probability distribution value $P_1$ of the first information bit sequence means that the first communications device determines values of the first frozen bit sequence based on the probability distribution value $P_1$ of the first information bit sequence. That is, the values of the first frozen bit sequence are not all 0s by default, and the values of the first frozen bit sequence are related to the probability distribution value $P_1$ of the first information bit sequence.

In a possible implementation, a specific implementation in which the first communications device determines the first frozen bit sequence based on the probability distribution value $P_1$ of the first information bit sequence is as follows: The first communications device selects a probability distribution value $P_0$ in a probability distribution value set P based on the probability distribution value $P_1$ of the first information bit sequence, where the probability distribution value $P_0$ is a probability distribution value closest to the probability distribution value $P_1$ in the probability distribution value set P, and one probability distribution value in the probability distribution value set P corresponds to one frozen bit sequence mapping manner; and determines the first frozen bit sequence based on a frozen bit sequence mapping manner corresponding to the probability distribution value $P_0$.

The probability distribution value set P is a set preset on a coder side and a decoder side. The probability distribution value set P includes a plurality of probability distribution values, and different probability distribution values correspond to different frozen bit sequence mapping manners. That is, different probability distribution values in the probability distribution value set P correspond to different frozen bit sequence values.

For example, it is assumed that the probability distribution value set P includes {0.2, 0.4, 0.5, 0.7}. The probability distribution value 0.2 corresponds to a frozen bit sequence mapping manner 1, the probability distribution value 0.4 corresponds to a frozen bit sequence mapping manner 2, the probability distribution value 0.5 corresponds to a frozen bit sequence mapping manner 3, and the probability distribution value 0.7 corresponds to a frozen bit sequence mapping manner 4. Assuming that the probability distribution value $P_1$ is 0.48, the first communications device obtains the probability distribution value 0.5 from the probability distribution value set P, and determines the values of the first frozen bit sequence based on the frozen bit sequence mapping manner 3 corresponding to the probability distribution value 0.5.

Based on this possible implementation, different probability distribution values in the probability distribution value set P may correspond to different frozen bit sequence mapping manners. In this way, when the decoder side sequentially tries different probability distribution values in the probability distribution value set and frozen bit sequences corresponding to the probability distribution values to perform decoding, the decoder side can better distinguish between different probability distribution values, thereby reducing an error detection probability.

Optionally, the frozen bit sequence mapping manner corresponding to the probability distribution value $P_0$ may specifically include the following four manners:

Manner 1: The first frozen bit sequence is determined based on a basic sequence corresponding to the probability distribution value $P_0$, and the basic sequence is determined based on a quantity of probability distribution values included in the probability distribution value set P.

Different probability distribution values in the probability distribution value set P correspond to different basic sequences.

For example, it is assumed that the probability distribution value set P includes {0.2, 0.4, 0.5, 0.7}, and the quantity of probability distribution values in the probability distribution value set P is 4. In this case, the four probability distribution values may be represented by using two bits. The probability distribution value 0.2 is represented by using a basic sequence 00, the probability distribution value 0.4 is represented by using a basic sequence 01, the probability distribution value 0.5 is represented by using a basic sequence 10, and the probability distribution value 0.7 is represented by using a basic sequence 11.

A frozen bit sequence mapping manner 1 corresponding to the probability distribution value 0.2 is determining a frozen bit sequence based on the basic sequence 00. A frozen bit sequence mapping manner 2 corresponding to the probability distribution value 0.4 is determining a frozen bit sequence based on the basic sequence 01. A frozen bit sequence mapping manner 3 corresponding to the probability distribution value 0.5 is determining a frozen bit sequence based on the basic sequence 10. A frozen bit sequence mapping manner 4 corresponding to the probability distribution value 0.7 is determining a frozen bit sequence based on the basic sequence 11.

Optionally, the values of the first frozen bit sequence may be obtained by directly extending or cross-extending the basic sequence corresponding to the probability distribution value $P_0$.

The direct extension is used as an example. It is assumed that a length of the first frozen bit sequence is 4. If the probability distribution value $P_0$ is 0.2, the basic sequence 00 may be directly extended to obtain a first frozen bit sequence 0000. If the probability distribution value $P_0$ is 0.4, the basic sequence 01 may be directly extended to obtain a first frozen bit sequence 0101. If the probability distribution value $P_0$ is 0.5, the basic sequence 10 may be directly extended to obtain a first frozen bit sequence 1010. If the probability distribution value $P_0$ is 0.7, the basic sequence 11 may be directly extended to obtain a first frozen bit sequence 1111.

The cross extension is used as another example. If the probability distribution value $P_0$ is 0.2, the basic sequence 00 may be cross-extended to obtain a first frozen bit sequence 0000. If the probability distribution value $P_0$ is 0.4, the basic sequence 01 may be cross-extended to obtain a first frozen bit sequence 0011. If the probability distribution value $P_0$ is 0.5, the basic sequence 10 may be cross-extended to obtain a first frozen bit sequence 1100. If the probability distribution value $P_0$ is 0.7, the basic sequence 11 may be cross-extended to obtain a first frozen bit sequence 1111.

In the frozen bit sequence mapping manner described in the manner 1, the coder/decoder side needs to store only basic sequences and relationships between first frozen bit sequences and the basic sequences, to help reduce storage overheads, and also ensure that different first frozen bit sequences are orthogonal to a specific extent, thereby reducing an error detection probability.

Manner 2: The first frozen bit sequence is determined based on an m-sequence corresponding to the probability distribution value $P_0$.

Different probability distribution values in the probability distribution value set P correspond to different m-sequences.

For example, it is assumed that the probability distribution value set P includes {0.2, 0.4, 0.5, 0.7}. The probability distribution value 0.2 corresponds to an m-sequence 1, the probability distribution value 0.4 corresponds to an m-sequence 2, the probability distribution value 0.5 corresponds to an m-sequence 3, and the probability distribution value 0.7 corresponds to an m-sequence 4.

A frozen bit sequence mapping manner 1 corresponding to the probability distribution value 0.2 is determining a frozen bit sequence based on the m-sequence 1. A frozen bit sequence mapping manner 2 corresponding to the probability distribution value 0.4 is determining a frozen bit sequence based on the m-sequence 2. A frozen bit sequence mapping manner 3 corresponding to the probability distribution value 0.5 is determining a frozen bit sequence based on the m-sequence 3. A frozen bit sequence mapping manner 4 corresponding to the probability distribution value 0.7 is determining a frozen bit sequence based on the m-sequence 4.

In a possible implementation, if a length of the m-sequence corresponding to the probability distribution value $P_0$ is greater than a length $N_f$ of the first frozen bit sequence, the first $N_f$ bits may be selected from the m-sequence as the values of the first frozen bit sequence. If a length of the m-sequence corresponding to the probability distribution value $P_0$ is less than a length $N_f$ of the first frozen bit sequence, a value 0 may be assigned to an excess frozen bit of the length of the m-sequence. For example, the probability distribution value $P_0$ is 0.2. If a length of the m-sequence 1 is 7, the m-sequence 1 is 1010101, and the length $N_f$ of the first frozen bit sequence is 5, the values of the first frozen bit sequence are 10101. If a length of the m-sequence 1 is 7, the m-sequence 1 is 1010101, and the length $N_f$ of the first frozen bit sequence is 10, the values of the first frozen bit sequence are 1010101000.

In the frozen bit sequence mapping manner described in the manner 2, the coder/decoder side needs to store only mapping relationships between first frozen bit sequences and m-sequences, to help reduce storage overheads, and also ensure that different first frozen bit sequences are orthogonal to a specific extent, thereby reducing an error detection probability.

Manner 3: The first frozen bit sequence is determined based on a Gold sequence corresponding to the probability distribution value $P_0$.

An implementation of the manner 3 is the same as the implementation of the manner 2. For a specific implementation of the manner 3, refer to the specific implementation of the manner 2. Details are not described herein.

Manner 4: The first frozen bit sequence is determined based on a pseudo-random sequence corresponding to the probability distribution value $P_0$.

An implementation of the manner 4 is the same as the implementation of the manner 2. For a specific implementation of the manner 4, refer to the specific implementation of the manner 2. Details are not described herein. The pseudo-random sequence is determined by the first communications device based on a random seed, and the random seed may be agreed on by both the first communications device and the second communications device by using signaling, or the random seed may be specified in a protocol in advance.

In a possible implementation, frozen bit sequence values corresponding to different probability distribution values and frozen bit sequence lengths may alternatively be directly defined in a protocol in advance. The first communications device determines, based on the probability distribution value $P_0$ and a length of the first frozen bit sequence, the values of the first frozen bit sequence from the plurality of frozen bit sequence values defined in the protocol in advance. For example, the protocol may have the following advance definitions: When a probability distribution value is 0.2 and a frozen bit sequence length is 2, corresponding frozen bit sequence values are 00. When a probability distribution value is 0.2 and a frozen bit sequence length is 4, corresponding frozen bit sequence values are 0000. When a probability distribution value is 0.4 and a frozen bit sequence length is 2, corresponding frozen bit sequence values are 10. When a probability distribution value is 0.4 and a frozen bit sequence length is 4, corresponding frozen bit sequence values are 1010. When a probability distribution value is 0.5 and a frozen bit sequence length is 2, corresponding frozen bit sequence values are 01. When a probability distribution value is 0.5 and a frozen bit sequence length is 4, corresponding frozen bit sequence values are 0101. When a probability distribution value is 0.7 and a frozen bit sequence length is 2, corresponding frozen bit sequence values are 11. When a probability distribution value is 0.7 and a frozen bit sequence length is 4, corresponding frozen bit sequence values are 1111.

303: The first communications device determines a check bit sequence based on a second information bit sequence.

The second information bit sequence is the first information bit sequence or a sequence obtained after a pre-transformation operation is performed on the first information bit sequence. A length of the second information bit sequence obtained after the pre-transformation operation is the same as a length of the first information bit sequence. Step 302 may be performed before or after step 303.

Optionally, the first communications device may perform the pre-transformation operation on the first information bit sequence based on the first frozen bit sequence, to obtain the second information bit sequence. For example, the second information bit sequence may meet the following formula (1):

$$u(src) = [x(src) - u(chk) * G(chk, src) - u(frz) * G(frz, src)] * G(src)^{-1} \quad (1)$$

u(src) is the second information bit sequence. x(src) is the first information bit sequence. u(chk) is the check bit sequence obtained based on the second information bit sequence, for example, u(chk)=CRC(u(src)) or PC(u(src)). G(chk, src) indicates that rows corresponding to a set chk and columns corresponding to a set src are selected from a polar matrix G. u(frz) is the first frozen bit sequence. G(frz, src) indicates that rows corresponding to a set frz and the columns corresponding to the set src are selected from the polar matrix G. G(src) indicates that rows and the columns corresponding to the set src are selected from the polar matrix G. The set src represents an information bit location set, the set chk represents a check bit location set, and the set frz represents a frozen bit set. To decouple performing the pre-transformation operation on the first information bit sequence from determining the check bit sequence based on the second information bit sequence so that u(src) obtained after the pre-transformation operation is related only to the first information bit sequence x(src) and the first frozen bit sequence u(frz) and then the pre-transformation operation can be performed before the check bit sequence is determined, the sets chk and src need to be found so that a constraint G(chk, src)=0 holds.

In a possible implementation, check bits include cyclic redundancy check (cyclic redundancy check, CRC) bits and/or parity check (parity check, PC) bits.

304: The first communications device obtains a first bit sequence based on the second information bit sequence, the check bit sequence, and the first frozen bit sequence.

The first bit sequence includes bits in the second information bit sequence, bits in the check bit sequence, and bits in the first frozen bit sequence.

In a possible implementation, a specific implementation in which the first communications device obtains the first bit sequence based on the second information bit sequence, the check bit sequence, and the first frozen bit sequence is as follows: The first communications device maps the bits in the second information bit sequence to information bit locations in an information bit set, maps the bits in the check bit sequence to check bit locations in the information bit set, and maps the bits in the first frozen bit sequence to frozen bit locations in the frozen bit set, to obtain the first bit sequence. The information bit set includes the information bit locations and the check bit locations in the first bit sequence, and the frozen bit set includes the frozen bit locations in the first bit sequence. The information bit set and the frozen bit set may be obtained based on a sum of the length of the second information bit sequence and a length of the check bit sequence and a coding length.

A (16, 12) code is used as an example. The coding length is 16, an information bit length is 12, and the information bit length is the sum of the length of the second information bit sequence and the length of the check bit sequence. The first communications device may obtain the information bit set and the frozen bit set based on the information bit length 12 and the coding length 16. The information bit set includes {4, 6, 7, 8, 9, 10, 11, 12, 13, 14, 15, 16}, the information bit locations in the information bit set include {8, 10, 11, 12, 13, 14, 15, 16}, and the check bit locations in the information bit set include {4, 6, 7, 9}. The frozen bit set includes {1, 2, 3, 5}. The first communications device maps eight bits in the second information bit sequence to the information bit locations {8, 10, 11, 12, 13, 14, 15, 16}, maps four bits in the check bit sequence to the check bit locations {4, 6, 7, 9}, and maps four bits in the first frozen bit sequence to the frozen bit set {1, 2, 3, 5}, to obtain the first bit sequence.

In a possible implementation, check bit locations in the first bit sequence are bit locations corresponding to rows whose sums are 1 in G(a), G(a) is a matrix including rows and columns in a set a in a polar matrix G, the polar matrix G is a polar matrix used for polar coding, the set a is an information bit set, and the information bit set includes information bit locations and the check bit locations in the first bit sequence. Based on this possible implementation, G(chk, src)=0 can hold. Therefore, performing the pre-transformation operation on the first information bit sequence is decoupled from determining the check bit sequence based on the second information bit sequence, so that the pre-transformation operation can be performed before the check bit sequence is determined, to reduce power consumption of the decoder side and improve decoding efficiency.

A (16, 12) code is used as an example. A coding length is 16, an information bit length is 12, and a frozen bit length is 4. The length of the second information bit sequence is 8, and a length of the check bit sequence is 4. A polar matrix G corresponding to the coding length is shown in the following Table 1:

TABLE 1

| Bit location sequence number | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 1 | 1 | 0 | 0 | 0 | 0 | 0 | 0 | 0 | 0 | 0 | 0 | 0 | 0 | 0 | 0 | 0 |
| 2 | 1 | 1 | 0 | 0 | 0 | 0 | 0 | 0 | 0 | 0 | 0 | 0 | 0 | 0 | 0 | 0 |
| 3 | 1 | 0 | 1 | 0 | 0 | 0 | 0 | 0 | 0 | 0 | 0 | 0 | 0 | 0 | 0 | 0 |
| 4 | 1 | 1 | 1 | 1 | 0 | 0 | 0 | 0 | 0 | 0 | 0 | 0 | 0 | 0 | 0 | 0 |
| 5 | 1 | 0 | 0 | 0 | 1 | 0 | 0 | 0 | 0 | 0 | 0 | 0 | 0 | 0 | 0 | 0 |
| 6 | 1 | 1 | 0 | 0 | 1 | 1 | 0 | 0 | 0 | 0 | 0 | 0 | 0 | 0 | 0 | 0 |
| 7 | 1 | 0 | 1 | 0 | 1 | 0 | 1 | 0 | 0 | 0 | 0 | 0 | 0 | 0 | 0 | 0 |
| 8 | 1 | 1 | 1 | 1 | 1 | 1 | 1 | 1 | 0 | 0 | 0 | 0 | 0 | 0 | 0 | 0 |
| 9 | 1 | 0 | 0 | 0 | 0 | 0 | 0 | 0 | 1 | 0 | 0 | 0 | 0 | 0 | 0 | 0 |
| 10 | 1 | 1 | 0 | 0 | 0 | 0 | 0 | 0 | 1 | 1 | 0 | 0 | 0 | 0 | 0 | 0 |
| 11 | 1 | 0 | 1 | 0 | 0 | 0 | 0 | 0 | 1 | 0 | 1 | 0 | 0 | 0 | 0 | 0 |
| 12 | 1 | 1 | 1 | 1 | 0 | 0 | 0 | 0 | 1 | 1 | 1 | 1 | 0 | 0 | 0 | 0 |
| 13 | 1 | 0 | 0 | 0 | 1 | 0 | 0 | 0 | 1 | 0 | 0 | 0 | 1 | 0 | 0 | 0 |
| 14 | 1 | 1 | 0 | 0 | 1 | 1 | 0 | 0 | 1 | 1 | 0 | 0 | 1 | 1 | 0 | 0 |
| 15 | 1 | 0 | 1 | 0 | 1 | 0 | 1 | 0 | 1 | 0 | 1 | 0 | 1 | 0 | 1 | 0 |
| 16 | 1 | 1 | 1 | 1 | 1 | 1 | 1 | 1 | 1 | 1 | 1 | 1 | 1 | 1 | 1 | 1 |

A decoding reliability order of bit locations may be {1, 2, 3, 5, 9, 4, 6, 7, 10, 11, 13, 8, 12, 14, 15, 16}, and 12 bit locations with highest reliability are selected as an information bit set. For example, {4, 6, 7, 8, 9, 10, 11, 12, 13, 14, 15, 16} may be selected as the information bit set. It is assumed that decoding is performed in a bit reversal order, and a corresponding order is {1, 9, 5, 13, 3, 11, 7, 15, 2, 10, 6, 14, 4, 12, 8, 16}. A decoding order of information bits is info_sorted={9, 13, 11, 7, 15, 10, 6, 14, 4, 12, 8, 16}.

G(info_sorted) is obtained based on the decoding order, that is, the $9^{th}$, $13^{th}$, $11^{th}$, $7^{th}$, $15^{th}$, $10^{th}$, $6^{th}$, $14^{th}$, $4^{th}$, $12^{th}$, $8^{th}$, and $16^{th}$ row and column are selected from the matrix G, to obtain a 12*12 matrix, shown in the following Table 2:

TABLE 2

| info_sorted sequence number | 9 | 13 | 11 | 7 | 15 | 10 | 6 | 14 | 4 | 12 | 8 | 16 |
|---|---|---|---|---|---|---|---|---|---|---|---|---|
| 9  | 1 | 0 | 0 | 0 | 0 | 0 | 0 | 0 | 0 | 0 | 0 | 0 |
| 13 | 1 | 1 | 0 | 0 | 0 | 0 | 0 | 0 | 0 | 0 | 0 | 0 |
| 11 | 1 | 0 | 1 | 0 | 0 | 0 | 0 | 0 | 0 | 0 | 0 | 0 |
| 7  | 0 | 0 | 0 | 1 | 0 | 0 | 0 | 0 | 0 | 0 | 0 | 0 |
| 15 | 1 | 1 | 1 | 1 | 1 | 0 | 0 | 0 | 0 | 0 | 0 | 0 |
| 10 | 1 | 0 | 0 | 0 | 0 | 1 | 0 | 0 | 0 | 0 | 0 | 0 |
| 6  | 0 | 0 | 0 | 0 | 0 | 0 | 1 | 0 | 0 | 0 | 0 | 0 |
| 14 | 1 | 1 | 0 | 0 | 1 | 1 | 1 | 1 | 0 | 0 | 0 | 0 |
| 4  | 0 | 0 | 0 | 0 | 0 | 0 | 0 | 0 | 1 | 0 | 0 | 0 |
| 12 | 1 | 0 | 1 | 0 | 0 | 1 | 0 | 0 | 1 | 1 | 0 | 0 |
| 8  | 0 | 0 | 0 | 1 | 0 | 0 | 1 | 0 | 1 | 0 | 1 | 0 |
| 16 | 1 | 1 | 1 | 1 | 1 | 1 | 1 | 1 | 1 | 1 | 1 | 1 |

To meet the constraint G(chk, src)=0, rows (rows in bold in Table 2) whose sums are 1 in G(info_sorted) may be counted. There are four bit locations {9, 7, 6, 4} in total. The four bit locations {9, 7, 6, 4} are the check bit locations.

In a possible implementation, at least one check bit in the check bit sequence is located in the bits included in the second information bit sequence. If decoding is performed in a non-bit-reversal order, the at least one check bit may be used to check an information bit in front of the at least one check bit, to implement a function of early decoding stopping. The early decoding stopping means that when the decoder side decodes some information bits in a to-be-decoded sequence, the decoder side may check the decoded information bits by using check bits, and if the check on the information bits fails, the decoder side stops decoding in advance, thereby reducing decoding power consumption.

For example, it is assumed that decoding is performed in a non-bit-reversal order, the information bit set is {4, 6, 7, 8, 9, 10, 11, 12, 13, 14, 15, 16}, and a decoding order is also {4, 6, 7, 8, 9, 10, 11, 12, 13, 14, 15, 16}. It is assumed that the check bit locations include {4, 9, 13, 14}. Check bits corresponding to check bit locations {4, 9} are used to check information bits corresponding to information bit locations {6, 7, 8}. Check bits corresponding to check bit locations {13, 14} are used to check information bits corresponding to information bit locations {10, 11, 12, 15, 16}. If check on the information bits corresponding to the information bit locations {6, 7, 8} fails, the decoder side may stop decoding in advance, to implement early decoding stopping.

In a possible implementation, a decoding order of at least one check bit in the check bit sequence is located in a decoding order of the bits included in the second information bit sequence. In this way, the at least one check bit may be used to check an information bit in front of the decoding order of the at least one check bit, to implement a function of early decoding stopping. For example, it is assumed that decoding is performed in a bit reversal order, and a decoding order of information bits is {9, 13, 11, 7, 15, 10, 6, 14, 4, 12, 8, 16}. The check bit locations include {9, 7, 6, 4}. Check bits corresponding to check bit locations {9, 7} are used to check information bits corresponding to information bit locations {13, 11}. Check bits corresponding to check bit locations {6, 4} are used to check information bits corresponding to information bit locations {8, 10, 12, 14, 15, 16}. If check on the information bits corresponding to the information bit locations {13, 11} fails, the decoder side may stop decoding in advance, to implement early decoding stopping.

305: The first communications device performs polar coding on the first bit sequence to obtain a second bit sequence.

In this embodiment of this application, after determining the first bit sequence, the first communications device may perform polar coding on the first bit sequence by using the polar matrix G, to obtain the second bit sequence.

Optionally, bits obtained after polar coding is performed on the check bits in the first bit sequence meet the following formula (2):

$$x(chk) = u(src) * G(src, chk) + u(chk) * G(chk) + u(frz) * G(frz, chk) \quad (2)$$

x(chk) is the bits obtained after polar coding is performed on the check bits in the first bit sequence. u(src) is the second information bit sequence. G(src, chk) indicates that the rows corresponding to the set src and columns corresponding to the set chk are selected from the polar matrix G. u(chk) is the check bit sequence. G(chk) indicates that the rows and the columns corresponding to the set chk are selected from the polar matrix G. u(frz) is the first frozen bit sequence. G(frz, chk) indicates that the rows corresponding to the set frz and the columns corresponding to the set chk are selected from the polar matrix G. The set src represents the information bit location set, the set chk represents the check bit location set, and the set frz represents the frozen bit set.

Optionally, bits obtained after polar coding is performed on the frozen bits in the first bit sequence meet the following formula (3):

$$x(frz) = u(src) * G(src, frz) + u(chk) * G(chk, frz) + u(frz) * G(frz) \quad (3)$$

x(frz) is the bits obtained after polar coding is performed on the frozen bits in the first bit sequence. u(src) is the second information bit sequence. G(src, frz) indicates that the rows corresponding to the set src and columns corresponding to the set frz are selected from the polar matrix G. u(chk) is the check bit sequence. G(chk, frz) indicates that the rows corresponding to the set chk and the columns corresponding to the set frz are selected from the polar matrix G. u(frz) is the first frozen bit sequence. G(frz) indicates that the rows and the columns corresponding to the set frz are selected from the polar matrix G. The set src represents the information bit location set, the set chk represents the check bit location set, and the set frz represents the frozen bit set.

306: The first communications device outputs the second bit sequence.

307: The first communications device modulates the second bit sequence to obtain a modulation symbol.

308: The first communications device sends the modulation symbol to the second communications device.

309: The second communications device obtains a to-be-decoded sequence.

In this embodiment of this application, after receiving the modulation symbol sent by the first communications device, the second communications device demodulates the modulation symbol to obtain the to-be-decoded sequence. The to-be-decoded sequence may be an LLR sequence. The LLR sequence includes three parts: an LLR sequence corresponding to a set src, an LLR sequence corresponding to a set chk, and an LLR sequence corresponding to a set frz. The set src represents an information bit location set, the set chk represents a check bit location set, and the set frz represents a frozen bit set. Alternatively, the to-be-decoded sequence may be another bit sequence or symbol sequence.

310: The second communications device sets i=1.

311: The second communications device decodes the to-be-decoded sequence based on an $i^{th}$ probability distribution value in the probability distribution value set P and a frozen bit sequence corresponding to the $i^{th}$ probability distribution value, to obtain a third bit sequence corresponding to the $i^{th}$ probability distribution value. The third bit sequence includes bits in a third information bit sequence, check bits, and bits in the frozen bit sequence corresponding to the $i^{th}$ probability distribution value.

312: The second communications device checks the third information bit sequence.

313: If the check on the third information bit sequence succeeds, the second communications device obtains the first information bit sequence based on the third information bit sequence, and stops decoding. The first information bit sequence is the third information bit sequence or the first information bit sequence is a sequence obtained after polar coding is performed on the third information bit sequence.

314: If the check on the third information bit sequence fails and i is less than x, the second communications device sets i=i+1, and returns to step 311. x is the quantity of probability distribution values included in the probability distribution value set P.

315: If the check on the third information bit sequence fails and i is equal to x, the second communications device stops decoding; or obtains a fourth information bit sequence based on a target information bit sequence, and stops decoding. The target information bit sequence is one of x third information bit sequences corresponding to the probability distribution value set P, and the fourth information bit sequence is the target information bit sequence or the fourth information bit sequence is a sequence obtained after polar coding is performed on the target information bit sequence.

In this embodiment of this application, i represents a decoding order of a probability distribution value in the probability distribution value set P. The $i^{th}$ probability distribution value represents the $i^{th}$ probability distribution value used to decode the to-be-decoded sequence in the probability distribution value set P. The second communications device sets i=1, indicating that the first probability distribution value used to decode the to-be-decoded sequence is selected from the probability distribution value set P. The second communications device sets i=1+1, indicating that a next probability distribution value used to decode the to-be-decoded sequence is selected from the probability distribution value set P.

For example, it is assumed that the probability distribution value set P includes {0.2, 0.5, 0.7}. The second communications device may first decode the to-be-decoded sequence based on the probability distribution value 0.2 and a frozen bit sequence corresponding to the probability distribution value 0.2, to obtain a third bit sequence 1 corresponding to the probability distribution value 0.2. The third bit sequence 1 includes bits in a third information bit sequence 1, check bits 1, and bits in the frozen bit sequence corresponding to the probability distribution value 0.2. If check on the third information bit sequence 1 succeeds, the second communications device obtains the first information bit sequence based on the third information bit sequence 1, and stops decoding. The first information bit sequence is the third information bit sequence 1 or the first information bit sequence is a sequence obtained after polar coding is performed on the third information bit sequence 1.

If check on the third information bit sequence 1 fails, the second communications device decodes the to-be-decoded sequence based on the probability distribution value 0.5 and a frozen bit sequence corresponding to the probability distribution value 0.5, to obtain a third bit sequence 2 corresponding to the probability distribution value 0.5. The third bit sequence 2 includes bits in a third information bit sequence 2, check bits 2, and bits in the frozen bit sequence corresponding to the probability distribution value 0.5. If check on the third information bit sequence 2 succeeds, the second communications device obtains the first information bit sequence based on the third information bit sequence 2, and stops decoding. The first information bit sequence is the third information bit sequence 2 or the first information bit sequence is a sequence obtained after polar coding is performed on the third information bit sequence 2.

If check on the third information bit sequence 2 fails, the second communications device decodes the to-be-decoded sequence based on the probability distribution value 0.7 and a frozen bit sequence corresponding to the probability distribution value 0.7, to obtain a third bit sequence 3 corresponding to the probability distribution value 0.7. The third bit sequence 3 includes bits in a third information bit sequence 3, check bits 3, and bits in the frozen bit sequence corresponding to the probability distribution value 0.7. If check on the third information bit sequence 3 succeeds, the second communications device obtains the first information bit sequence based on the third information bit sequence 3, and stops decoding. The first information bit sequence is the third information bit sequence 3 or the first information bit sequence is a sequence obtained after polar coding is performed on the third information bit sequence 3.

If check on the third information bit sequence 3 fails, the second communications device may stop decoding, or select a third information bit sequence from the third information bit sequence 1 to the third information bit sequence 3, to determine the fourth information bit sequence. For example, if the third information bit sequence 2 is selected to determine the fourth information bit sequence, the fourth information bit sequence may be the third information bit sequence 2 or the fourth information bit sequence is a sequence obtained after polar coding is performed on the third information bit sequence 2.

The following describes, by using an example in which the to-be-decoded sequence is an LLR sequence, a possible implementation in which the second communications device decodes the to-be-decoded sequence based on the $i^{th}$ probability distribution value and the frozen bit sequence corresponding to the $i^{th}$ probability distribution value, to obtain the third bit sequence corresponding to the $i^{th}$ probability distribution value.

The second communications device may correct, based on the $i^{th}$ probability distribution value, values of an LLR sequence corresponding to a set src in the to-be-decoded sequence, to obtain a corrected LLR sequence corresponding to the set src. For example, the corrected LLR sequence corresponding to the set src meets the following formula (4):

$$LLR'(src) = LLR(src) + \log((1 - P_{i,r})/P_{i,r}) \quad (4)$$

LLR(src) is the LLR sequence corresponding to the set src, and LLR'(src) is an LLR sequence that corresponds to the set src and that is obtained after the LLR sequence corresponding to the set src is corrected based on the $i^{th}$ probability distribution value. $P_{i,r}$ is the $i^{th}$ probability distribution value. The second communications device decodes a corrected to-be-decoded sequence based on the frozen bit sequence corresponding to the $i^{th}$ probability distribution value, to obtain the third bit sequence corresponding to the $i^{th}$ probability distribution value. The corrected to-be-decoded sequence includes three parts: an LLR sequence corresponding to a set chk, an LLR sequence corresponding to a set frz, and the corrected LLR sequence corresponding to the set src.

Optionally, the second communications device may decode the corrected to-be-decoded sequence based on the frozen bit sequence corresponding to the $i^{th}$ probability distribution value, an information bit set, and a frozen bit set, to obtain the third bit sequence corresponding to the $i^{th}$ probability distribution value. The information bit set includes information bit locations and check bit locations in the third bit sequence, and the frozen bit set includes frozen bit locations in the third bit sequence. The second communications device may obtain the information bit set and the frozen bit set based on a sum of a length of the third information bit sequence and a length of a check bit sequence and a coding length. The information bit set and the frozen bit set that are used by the second communications device for decoding are the same as the information bit set and the frozen bit set that are used by the first communications device for coding. That is, the information bit locations in the third bit sequence are the same as the information bit locations in the first bit sequence, the check bit locations in the third bit sequence are the same as the check bit locations in the first bit sequence, and the frozen bit locations in the third bit sequence are the same as the frozen bit locations in the first bit sequence.

Optionally, the second communications device may enter the frozen bit sequence corresponding to the $i^{th}$ probability distribution value, the information bit set, the frozen bit set, and the corrected to-be-decoded sequence into a CRC-aided successive cancellation list (CRC-aided successive cancellation list, CA-SCL) decoder, a parity check successive cancellation list (parity check successive cancellation list, PC-SCL) decoder, or another polar decoder for decoding, to obtain the third bit sequence corresponding to the $i^{th}$ probability distribution value.

In a possible implementation, one probability distribution value in the probability distribution value set P corresponds to one frozen bit sequence mapping manner, and the second communications device may further determine, based on a frozen bit sequence mapping manner corresponding to the $i^{th}$ probability distribution value, the frozen bit sequence corresponding to the $i^{th}$ probability distribution value.

Optionally, the frozen bit sequence mapping manner corresponding to the $i^{th}$ probability distribution value may specifically include the following four manners:

Manner 1: The frozen bit sequence corresponding to the $i^{th}$ probability distribution value is determined based on a basic sequence corresponding to the $i^{th}$ probability distribution value, and the basic sequence is determined based on the quantity of probability distribution values included in the probability distribution value set P.

Manner 2: The frozen bit sequence corresponding to the $i^{th}$ probability distribution value is determined based on an m-sequence corresponding to the $i^{th}$ probability distribution value.

Manner 3: The frozen bit sequence corresponding to the $i^{th}$ probability distribution value is determined based on a Gold sequence corresponding to the $i^{th}$ probability distribution value.

Manner 4: The frozen bit sequence corresponding to the $i^{th}$ probability distribution value is determined based on a pseudo-random sequence corresponding to the $i^{th}$ probability distribution value.

For a specific implementation in which the second communications device determines, based on the frozen bit sequence mapping manner corresponding to the $i^{th}$ probability distribution value, the frozen bit sequence corresponding to the $i^{th}$ probability distribution value, refer to the foregoing specific implementation in which the first communications device determines the first frozen bit sequence based on the frozen bit sequence mapping manner corresponding to the probability distribution value $P_0$. Details are not described herein.

In a possible implementation, frozen bit sequence values corresponding to different probability distribution values and frozen bit sequence lengths may alternatively be directly defined in a protocol in advance. The second communications device determines, based on the probability distribution value and a length of the frozen bit sequence, values of the frozen bit sequence corresponding to the probability distribution value from the plurality of frozen bit sequence values defined in the protocol in advance.

In a possible implementation, check bit locations in the third bit sequence are bit locations corresponding to rows whose sums are 1 in G(a), G(a) is a matrix including rows and columns in a set a in a polar matrix G, the polar matrix G is a polar matrix used for the polar coding, the set a is an information bit set, and the information bit set includes information bit locations and the check bit locations in the third bit sequence. Based on this possible implementation, on the coder side, the pre-transformation operation of the first information bit sequence may be decoupled from the operation of determining the check bit sequence based on the second information bit sequence, so that the pre-transformation operation can be performed before the check bit sequence is determined. In this way, the decoder side needs to perform a polar operation only on an information bit sequence that is obtained through decoding and that is successfully checked, to obtain the first information bit sequence sent by the coder side, to reduce power consumption of the decoder side and improve decoding efficiency.

In a possible implementation, at least one of the check bits is located in the bits included in the third information bit sequence. In this way, the at least one check bit may be used to check an information bit located in front of the at least one check bit. This helps implement a function of early decoding stopping.

In a possible implementation, a decoding order of at least one of the check bits is located in a decoding order of the bits included in the third information bit sequence. In this way, the at least one check bit may be used to check an information bit in front of the decoding order of the at least one check bit, to implement a function of early decoding stopping.

In this embodiment of this application, if the second information bit sequence on a first communications device side is the first information bit sequence, if the check on the third information bit sequence succeeds, the second communications device determines that the third information bit sequence is the first information bit sequence. That is, the first communications device may not perform the pre-transformation operation on the first information bit sequence. Correspondingly, the second communications device does not need to perform polar coding on the third information bit sequence. It may be learned that, in this way, processing overheads of the first communications device and the second communications device can be reduced.

In this embodiment of this application, if the second information bit sequence on a first communications device side is the sequence obtained after the pre-transformation operation is performed on the first information bit sequence, if the check on the third information bit sequence succeeds, the second communications device determines that the sequence obtained after polar coding is performed on the third information bit sequence is the first information bit sequence. That is, the first communications device may first perform the pre-transformation operation on the first information bit sequence, and then determine the check bit sequence based on the second information bit sequence obtained after the pre-transformation operation. The second communications device needs to perform polar coding only on a third information bit sequence that is obtained through decoding and that is successfully checked, to obtain the first information bit sequence sent by the first communications device. This helps reduce power consumption of the decoder side and improve decoding efficiency. If the first communications device first determines the check bit sequence based on the first information bit sequence, and then performs the pre-transformation operation on the first information bit sequence, the second communications device needs to perform polar coding on a third information bit sequence obtained through decoding based on each probability distribution value, and then check (for example, perform CRC or PC on) an information bit sequence obtained after the polar operation. In this way, power consumption of the decoder side is relatively high and decoding efficiency is low.

In a possible implementation, if the probability distribution value $P_1$ is not equiprobable distribution, the second information bit sequence is the sequence obtained after the pre-transformation operation is performed on the first information bit sequence; or if the probability distribution value $P_1$ is equiprobable distribution, the second information bit sequence is the first information bit sequence. Correspondingly, if the $i^{th}$ probability distribution value is not equiprobable distribution, the first information bit sequence is the sequence obtained after polar coding is performed on the third information bit sequence; or if the $i^{th}$ probability distribution value is equiprobable distribution, the first information bit sequence is the third information bit sequence.

Figure 4:
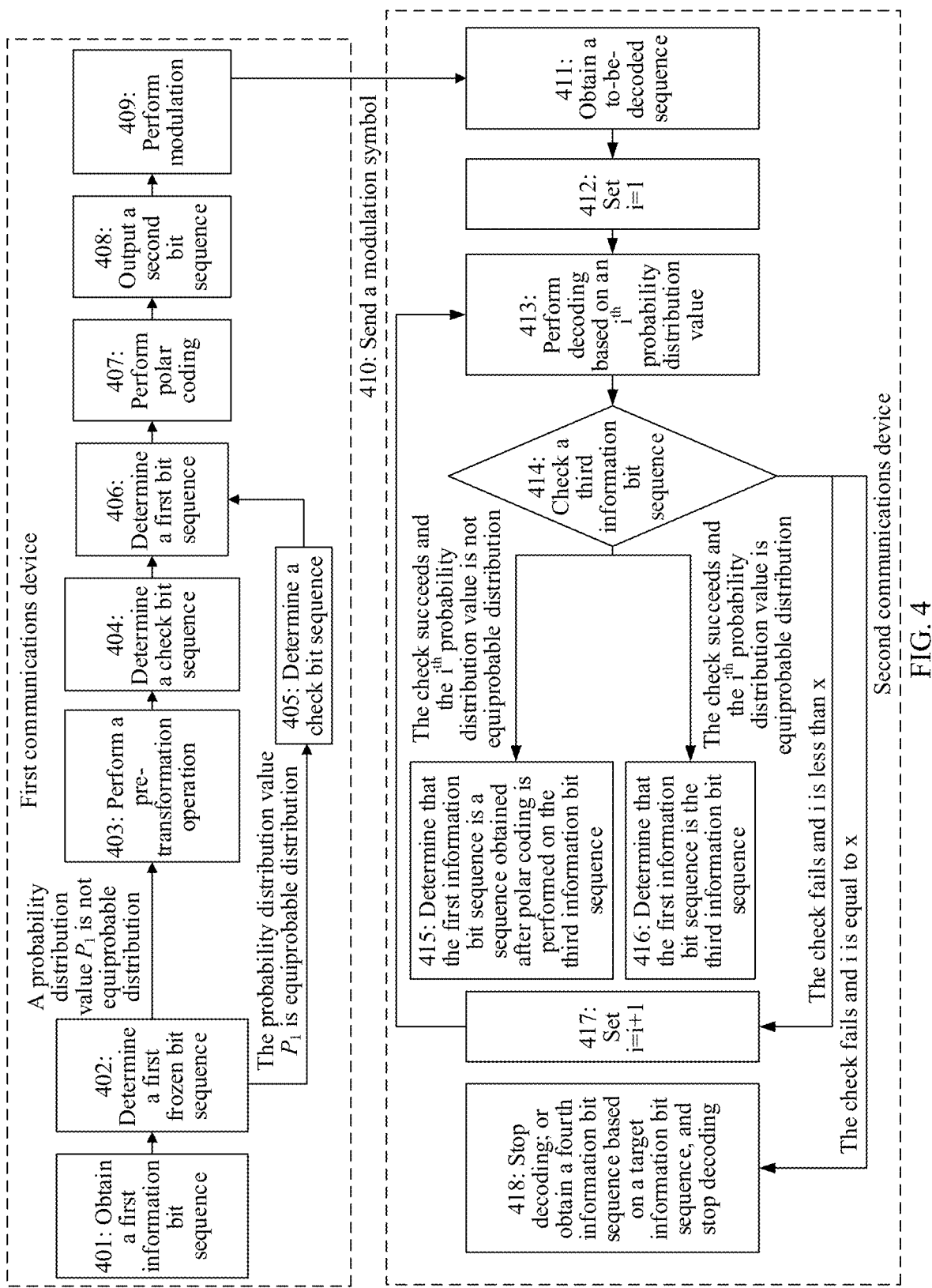
FIG. 4 is a schematic flowchart of another coding and decoding method according to an embodiment of this application.

That is, when the probability distribution value $P_1$ is not equiprobable distribution, the first communications device needs to perform the pre-transformation operation on the first information bit sequence; or when the probability distribution value $P_1$ is equiprobable distribution, the first communications device does not need to perform the pre-transformation operation on the first information bit sequence. If the $i^{th}$ probability distribution value is not equiprobable distribution, the second communications device needs to perform polar coding on the third information bit sequence to obtain the first information bit sequence; or if the $i^{th}$ probability distribution value is equiprobable distribution, the second communications device does not need to perform polar coding on the third information bit sequence, and the second communications device directly determines the third information bit sequence as the first information bit sequence. For example, this is shown in step 402 to step 405 and step 415 and step 416 in FIG. 4. Specific implementations of other steps in FIG. 4 are the same as the specific implementations of the corresponding steps in FIG. 3, and details are not described herein again.

It may be learned that, based on this possible implementation, two implementations in which the pre-transformation operation is performed on the first information bit sequence and the pre-transformation operation is not performed on the first information bit sequence may be properly compatible in a system, and two implementations in which the third information bit sequence is determined as the first information bit sequence and the sequence obtained after polar coding is performed on the third information bit sequence is determined as the first information bit sequence may be properly compatible in the system. When the pre-transformation operation is performed on the first information bit sequence, decoding performance is improved by using sparseness of the first information bit sequence. When the probability distribution value of the first information bit sequence is far away from equiprobable distribution, it indicates that the first information bit sequence is very sparse. When the probability distribution value of the first information bit sequence is equiprobable distribution, it indicates that the first information bit sequence is not sparse. Therefore, when the probability distribution value of the first information bit sequence is equiprobable distribution, the pre-transformation operation does not need to be performed on the first information bit sequence, to reduce processing overheads of the first communications device and the second communications device.

In a possible implementation, if $|P_1-0.5|\le\in$, the probability distribution value $P_1$ is equiprobable distribution, where $\in$ is a preset value. If $|P_{i,r}-0.5|\le\in$, the $i^{th}$ probability distribution value is equiprobable distribution, where $\in$ is a preset value, and $P_{i,r}$ is the $i^{th}$ probability distribution value. $\in$ may be a relatively small value, for example, may be 0.001, 0.01, 0.02, 0.03, 0.04, or 0.05.

It should be noted that a decoding order of probability distribution values in the probability distribution value set P may be unrelated to the probability distribution values, that is, decoding is not necessarily performed in descending order or ascending order of the probability distribution values. The following describes manners of determining the decoding order of the probability distribution values in the probability distribution value set P.

Manner 1: The decoding order of the probability distribution values in the probability distribution value set P is determined based on information entropies corresponding to the probability distribution values in the probability distribution value set.

A probability distribution value with a larger information entropy indicates lower sparsity, and a probability distribution value with a smaller information entropy indicates higher sparsity. Two probability distribution values whose sum is 1 (for example, P'+P"=1) are equal in information entropy and consistent in sparsity. When a probability distribution value is 0.5, an information entropy is the largest, that is, the information entropy is 1, indicating that source bits are not sparse at all. The decoding order of the probability distribution values in the probability distribution value set P is determined based on the information entropies corresponding to the probability distribution values in the probability distribution value set, thereby helping reduce an error detection probability.

In a possible implementation, an information entropy corresponding to the $i^{th}$ probability distribution value is greater than or equal to an information entropy corresponding to an $(i+1)^{th}$ probability distribution value. That is, the second communications device may preferentially use a probability distribution value with a relatively large information entropy to perform decoding. Because a probability distribution value with a relatively large information entropy has less prior information that can be used by the decoder side, the probability distribution value is preferentially tried, so that negative impact caused on a decoding effect by the decoder side by introducing incorrect prior information can be reduced, thereby reducing an error detection probability.

For example, if the probability distribution value set P includes a probability distribution value 1, a probability distribution value 2, and a probability distribution value 3, an information entropy of the probability distribution value 1 is greater than an information entropy of the probability distribution value 2, and the information entropy of the probability distribution value 2 is greater than an information entropy of the probability distribution value 3, the second communications device first decodes the to-be-decoded sequence based on the probability distribution value 1. If check on a decoding result fails, the second communications device decodes the to-be-decoded sequence based on the probability distribution value 2. If check on a decoding result fails, the second communications device decodes the to-be-decoded sequence based on the probability distribution value 3.

Optionally, if two probability distribution values correspond to equal information entropies, a probability distribution value less than 0.5 in the two probability distribution values is first tried. Alternatively, if two probability distribution values correspond to equal information entropies, a probability distribution value greater than 0.5 in the two probability distribution values is first tried.

Manner 2: The decoding order of the probability distribution values in the probability distribution value set P is determined based on historical probability distribution values of a transmitting end.

For example, if the probability distribution value set P includes a probability distribution value 1, a probability distribution value 2, and a probability distribution value 3, historical usage of the transmitting end for the probability distribution value 1 is higher than historical usage of the transmitting end for the probability distribution value 2, and the historical usage of the transmitting end for the probability distribution value 2 is higher than historical usage of the transmitting end for the probability distribution value 3, the second communications device first decodes the to-be-decoded sequence based on the probability distribution value 1. If check on a decoding result fails, the second communications device decodes the to-be-decoded sequence based on the probability distribution value 2. If check on a decoding result fails, the second communications device decodes the to-be-decoded sequence based on the probability distribution value 3.

The manner 2 helps reduce a quantity of times the decoder side tries to perform decoding, and reduce decoding power consumption.

Manner 3: The first communications device may further send a probability distribution reference value range or a probability distribution reference value to the second communications device every N information bit sequences, where N is an integer greater than 1. The second communications device may further receive the probability distribution reference value range or the probability distribution reference value sent by the first communications device every N information bit sequences. The decoding order of the probability distribution values in the probability distribution value set P is determined based on the probability distribution reference value range or the probability distribution reference value.

For example, the first communications device may send a probability distribution reference value range or a probability distribution reference value to the second communications device once every five information bit sequences. Assuming that a probability distribution reference value sent by the first communications device in a current cycle is 0.5, the second communications device preferentially uses the probability distribution value 0.5 to decode the to-be-decoded sequence. Assuming that a probability distribution reference value range sent by the first communications device in a current cycle is 0.3 to 0.5, the second communications device preferentially uses a probability distribution value within the probability distribution reference value range 0.3 to 0.5 in the probability distribution value set P to decode the to-be-decoded sequence.

The manner 3 helps reduce a quantity of times the decoder side tries to perform decoding, and reduce decoding power consumption.

In a possible implementation, if the second information bit sequence on the first communications device side is the first information bit sequence, the fourth information bit sequence is the target information bit sequence. If the second information bit sequence on the first communications device side is the sequence obtained after the pre-transformation operation is performed on the first information bit sequence, the fourth information bit sequence is the sequence obtained after polar coding is performed on the target information bit sequence.

In a possible implementation, the target information bit sequence is a third information bit sequence corresponding to equiprobable distribution in the probability distribution value set P. Because the second communications device does not know a real probability distribution value, when check on the third information bit sequences corresponding to all the probability distribution values fails, it is a conservative solution to obtain the fourth information bit sequence based on the third information bit sequence corresponding to equiprobable distribution, so that a negative effect caused by incorrectly using a probability distribution value can be avoided.

In a possible implementation, the first communications device may further adjust a coding rate. For example, the first communications device may adjust the coding rate based on a transmission resource of the system. In this way, the coding rate can be more flexible.

Optionally, if the first communications device adjusts the coding rate, the first communications device may determine a first code based on an adjusted coding rate. The first code may be obtained by puncturing or shortening a mother code based on a punctured bit set or a shortened bit set. The first communications device may determine an information bit set and a frozen bit set of the first code based on the mother code. The first communications device determines the first bit sequence based on the first information bit sequence, the check bit sequence, the first frozen bit sequence, and the information bit set and the frozen bit set of the first code. After performing polar coding on the first bit sequence, the first communications device punctures or shortens, based on the punctured bit set/shortened bit set, a bit sequence obtained after the polar coding, to obtain the second bit sequence.

In a possible implementation, in a scenario in which the coding rate is adjusted, punctured bits/shortened bits corresponding to the first code may be first selected from the mother code, and then information bits of the first code may be selected from remaining locations in the mother code. For example, the first code is a (30, 20) code, and a corresponding mother code length of the first code is 32. If puncturing is performed in a bit reversal order, locations {1, 17} need to be punctured. Based on decoding reliability of remaining locations {2 to 16, 18 to 32}, 20 most reliable locations are selected as the information bits, to obtain the information bit set of the first code: info={4, 6, 7, 8, 10, 12, 14, 15, 16, 20, 22, 23, 24, 26, 27, 28, 29, 30, 31, 32}. Rows whose sums are 1 (meeting a constraint G(chk, src)=0) in G(info) are counted to obtain six information bit locations {4, 6, 7, 10, 27, 29}, that is, the check bit set of the first code includes {4, 6, 7, 10, 27, 29}.

In a possible implementation, for a same mother code, a nesting relationship between check bit locations may be constructed for different code lengths and code rates, to facilitate saving of optional check bit locations for different code lengths and code rates in the system.

1. It is assumed that an optional check bit set in an (N, K) code is $chk_{(N,K)}$.
2. (N, K) code→(N, K−1) code: An information bit i with lowest decoding reliability in K information bits of the (N, K) code is changed to a frozen bit.
   (a) An optional check bit set in the (N, K−1) code is $chk_{(N,K-1)}=chk_{(N,K)} \setminus \{i\}$.
   (b) Non-zero locations (denoted as Idx') in G(info\{i}, i) are found, rows (denoted as Idx") whose sums are 1 in G(Idx', info\{i}) are evaluated, and $chk_{(N,K-1)}=chk_{(N,K-1)} \cup Idx"$ is obtained through updating (a check bit may be placed in an information bit whose coupling relationship is removed). G(a, b) indicates that rows corresponding to a set a and columns corresponding to a set b are selected from a polar matrix G.
3. (N, K) code→(N−1, K) code:
   (a) If frozen bits are punctured/shortened, the optional check bit set remains unchanged, and an optional check bit set in the (N−1, K) code is $chk_{(N-1,K)}=chk_{(N,K)}$.
   (b) If information bits are punctured/shortened, a frozen bit f with highest decoding reliability in (N−K) frozen bits needs to be changed to an information bit.
   (b1) G(f, info u {f}) is evaluated. If a sum is 1, $chk_{(N-1,K)}=chk_{(N,K)} \setminus \{f\}$; otherwise, $chk_{(N-1,K)}=chk_{(N,K)}$.
   (b2) Non-zero locations (denoted as Idx') in $G(chk_{(N,K)}, f)$ are found. Coupling relationships may be generated at these locations, and therefore need to be removed from the check bit set. $chk_{(N-1,K)}=Chk_{(N-1,K)} \lor dx'$.
4. (N, K) code→(N−1, K−1) code:
   (a) If information bits are punctured/shortened, the operations (a) and (b) in 2 are repeated to obtain an optional check bit set $chk_{(N-1,K-1)}$ in the (N−1, K−1) code.
   (b) If frozen bits are punctured/shortened, an optional check bit set $chk_{(N-1,K-1)}$ in the (N−1, K−1) code is consistent with the optional check bit set $chk_{(N,K-1)}$ in the (N, K−1) code.

Figure 5:
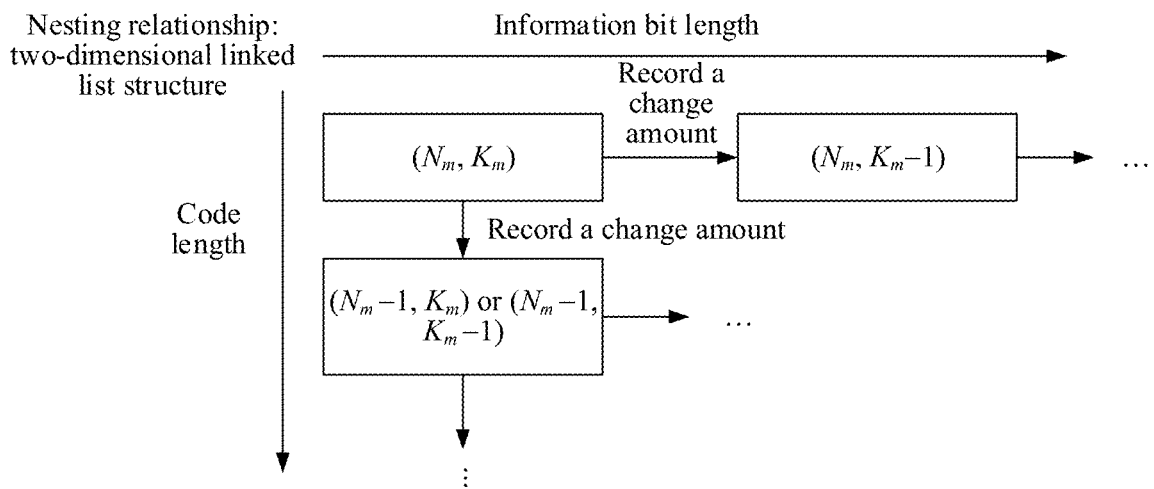
FIG. 5 is a schematic diagram of a nesting relationship according to an embodiment of this application.

Based on the foregoing operations 1 to 4, various code length and code rate combinations in puncturing/shortening are sequentially constructed by using a mother code ($N_m$, $K_m$) as a reference ($K_m/N_m$ corresponds to a highest code rate). During storage, a two-dimensional linked list structure is used, including two dimensions: a code length and an information bit length. As shown in FIG. 5, a complete optional check bit set needs to be stored only for the mother code ($N_m$, $K_m$), and only a change amount of the optional check bit set needs to be stored for another combination.

A mother code (32, 20) is used as an example. An information bit length of the mother code is 20, and a frozen bit length is 12. Based on decoding reliability, 20 most reliable locations are selected as information bits, to obtain an information bit set info={4, 6, 7, 8, 10, 12, 14, 15, 16, 20, 22, 23, 24, 26, 27, 28, 29, 30, 31, 32}. Rows whose sums are 1 (meeting a constraint G(chk, src)=0) in G(info) are counted to obtain six information bit locations {4, 6, 7, 10, 27, 29}, that is, a maximum of six check bits can be arranged.

Then, an optional check bit set $chk_{(32,20)}=\{4, 6, 7, 10, 27, 29\}$ of the (32, 20) code is used to separately obtain a set of a (32, 19) code, a set of a (31, 20) code, and a set of a (31, 19) code.

1. (32, 19) code:
   (a) The information bit 7 with lowest reliability is changed to a frozen bit, where an updated information bit set is info'={4, 6, 8, 10, 12, 14, 15, 16, 20, 22, 23, 24, 26, 27, 28, 29, 30, 31, 32}.
   (b) $chk_{(32,19)}=chk_{(32,20)} \setminus \{7\}=\{4, 6, 10, 27, 29\}$ is obtained through updating.
   (c) Non-zero locations (denoted as Idx') in G(info'\{7}, 7) are found, that is, Idx'={8, 15, 16, 23, 24, 31, 32}; rows (denoted as Idx") whose sums are 1 in G(Idx', info'\{7}) are evaluated, that is, Idx"={15, 23}; and $chk_{(32,19)}=chk_{(32,19)} \cap Idx"=\{4, 6, 10, 15, 23, 27, 29\}$ is further obtained through updating.
   (d) A change value set {7, 15, 23} of $chk_{(32,19)}$ and $chk_{(32,20)}$ is recoded.
2. (31, 20) code: For example, puncturing is performed in a bit reversal order. A location {1} needs to be punctured. Because the location is a frozen bit, the optional check bit set remains unchanged, that is, $chk_{(31,20)}=chk_{(32,20)}$. A change value set ∅ of $chk_{(31,20)}$ and $chk_{(32,20)}$ is recorded.
3. (31, 19) code: For example, puncturing is performed in a bit reversal order. A location {1} needs to be punctured. Because the location is a frozen bit, $chk_{(31,19)}=chk_{(32,19)}$ may be directly obtained. A change value set {7, 15, 23} of $chk_{(31,19)}$ and $chk_{(32,20)}$ is recorded.

Figure 6:
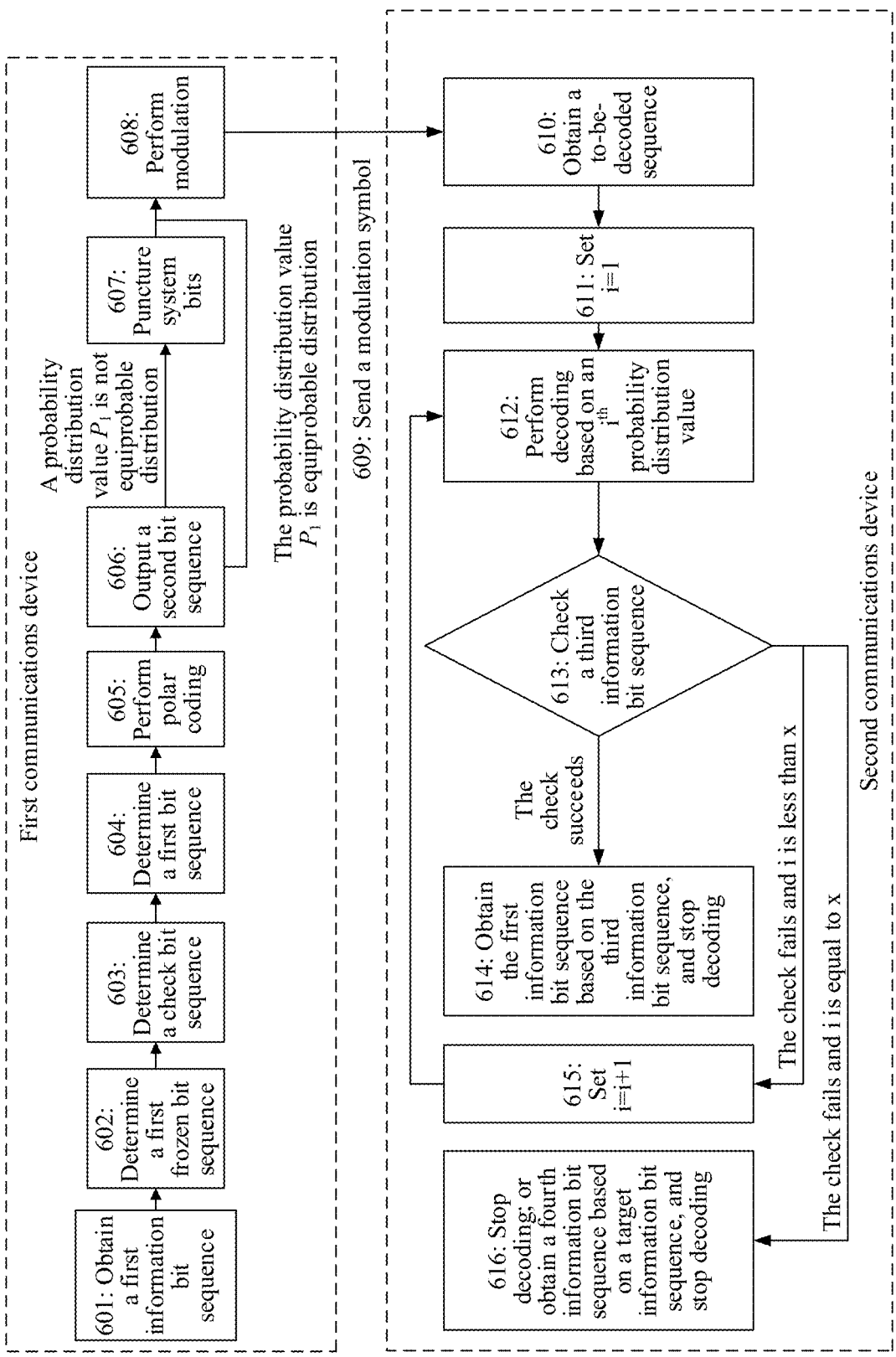
FIG. 6 is a schematic flowchart of still another coding and decoding method according to an embodiment of this application.

In a possible implementation, when the probability distribution value $P_1$ is not equiprobable distribution, the first communications device may puncture system bits in the second bit sequence, to obtain a bit sequence obtained after the system bits are punctured, to implement information bit compression. After puncturing the system bits in the second bit sequence, the first communications device modulates the bit sequence obtained after the system bits are punctured, and sends an obtained modulation symbol to the second communications device. When the probability distribution value $P_1$ is equiprobable distribution, the first communications device may modulate the second bit sequence, and send an obtained modulation symbol to the second communications device. For example, this is shown in step 607 in FIG. 6. Specific implementations of other steps in FIG. 6 are the same as the specific implementations of the corresponding steps in FIG. 3, and details are not described herein again.

It may be learned that, based on the method described in FIG. 3, the values of the first frozen bit sequence are determined based on the probability distribution value of the first information bit sequence, instead of by setting the values of the first frozen bit sequence to all 0s by default. In this way, when decoding the to-be-decoded sequence, the decoder side may sequentially try different probability distribution values in the probability distribution value set and frozen bit sequences corresponding to the probability distribution values to perform decoding, so that the decoder side can better distinguish between different probability distribution values, thereby reducing an error detection probability.

Figure 7:
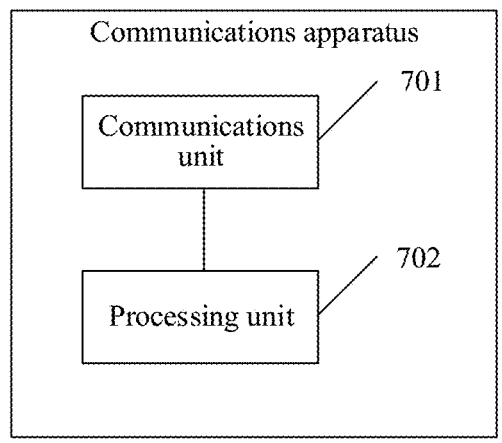
FIG. 7 is a schematic diagram of a structure of a communications apparatus according to an embodiment of this application.

FIG. 7 is a schematic diagram of a structure of a communications apparatus according to an embodiment of this application. The communications apparatus shown in FIG. 7 may be configured to perform some or all functions of the first communications device in the method embodiment described in FIG. 3, FIG. 4, or FIG. 6. The apparatus may be the first communications device, or may be an apparatus in the first communications device, or an apparatus that can be used together with the first communications device. The communications apparatus may alternatively be a chip system. The communications apparatus shown in FIG. 7 may include a communications unit 701 and a processing unit 702. The processing unit 702 is configured to process data. A receiving unit and a sending unit are integrated into the communications unit 701. The communications unit 701 may also be referred to as a transceiver unit. Alternatively, the communications unit 701 may be split into a receiving unit and a sending unit.

The processing unit 702 is configured to obtain a first information bit sequence. The processing unit 702 is further configured to determine a first frozen bit sequence based on a probability distribution value $P_1$ of the first information bit sequence. The processing unit 702 is further configured to determine a check bit sequence based on a second information bit sequence, where the second information bit sequence is the first information bit sequence or a sequence obtained after a pre-transformation operation is performed on the first information bit sequence. The processing unit 702 is further configured to obtain a first bit sequence based on the second information bit sequence, the check bit sequence, and the first frozen bit sequence, where the first bit sequence includes bits in the second information bit sequence, bits in the check bit sequence, and bits in the first frozen bit sequence. The processing unit 702 is further configured to perform polar coding on the first bit sequence to obtain a second bit sequence. The processing unit 702 is further configured to output the second bit sequence.

In a possible implementation, if the probability distribution value $P_1$ is not equiprobable distribution, the second information bit sequence is the sequence obtained after the pre-transformation operation is performed on the first information bit sequence; or if the probability distribution value $P_1$ is equiprobable distribution, the second information bit sequence is the first information bit sequence.

In a possible implementation, if $|P_1-0.5| \leq \in$, the probability distribution value $P_1$ is equiprobable distribution, where $\in$ is a preset value.

In a possible implementation, check bit locations in the first bit sequence are bit locations corresponding to rows whose sums are 1 in G(a), G(a) is a matrix including rows and columns in a set a in a polar matrix G, the polar matrix G is a polar matrix used for the polar coding, the set a is an information bit set, and the information bit set includes information bit locations and the check bit locations in the first bit sequence.

In a possible implementation, at least one check bit in the check bit sequence is located in the bits included in the second information bit sequence.

In a possible implementation, a manner in which the processing unit 702 determines the first frozen bit sequence based on the probability distribution value $P_1$ of the first information bit sequence is specifically: selecting a probability distribution value $P_0$ in a probability distribution value set P based on the probability distribution value $P_1$ of the first information bit sequence, where the probability distribution value $P_0$ is a probability distribution value closest to the probability distribution value $P_1$ in the probability distribution value set P, and one probability distribution value in the probability distribution value set P corresponds to one frozen bit sequence mapping manner; and determining the first frozen bit sequence based on a frozen bit sequence mapping manner corresponding to the probability distribution value $P_0$.

In a possible implementation, the first frozen bit sequence is determined based on a basic sequence corresponding to the probability distribution value $P_0$, and the basic sequence is determined based on a quantity of probability distribution values included in the probability distribution value set P.

In a possible implementation, the first frozen bit sequence is determined based on an m-sequence, a Gold sequence, or a pseudo-random sequence corresponding to the probability distribution value $P_0$.

In a possible implementation, a probability distribution reference value range or a probability distribution reference value is sent to a second communications device every N information bit sequences, where N is an integer greater than 1.

In a possible implementation, the check bits include cyclic redundancy check CRC bits and/or parity check PC bits.

FIG. 7 is a schematic diagram of a structure of a communications apparatus according to an embodiment of this application. The communications apparatus shown in FIG. 7 may be configured to perform some or all functions of the second communications device in the method embodiment described in FIG. 3, FIG. 4, or FIG. 6. The apparatus may be the second communications device, or may be an apparatus in the second communications device, or an apparatus that can be used together with the second communications device. The communications apparatus may alternatively be a chip system. The communications apparatus shown in FIG. 7 may include a communications unit 701 and a processing unit 702. The processing unit 702 is configured to process data. A receiving unit and a sending unit are integrated into the communications unit 701. The communications unit 701 may also be referred to as a transceiver unit. Alternatively, the communications unit 701 may be split into a receiving unit and a sending unit.

The processing unit 702 is configured to obtain a to-be-decoded sequence.

The processing unit 702 is further configured to set i=1.

The processing unit 702 is further configured to decode the to-be-decoded sequence based on an $i^{th}$ probability distribution value in a probability distribution value set P and a frozen bit sequence corresponding to the $i^{th}$ probability distribution value, to obtain a third bit sequence corresponding to the $i^{th}$ probability distribution value, where the third bit sequence includes bits in a third information bit sequence, check bits, and bits in the frozen bit sequence corresponding to the $i^{th}$ probability distribution value.

The processing unit 702 is further configured to check the third information bit sequence.

The processing unit 702 is further configured to: if the check on the third information bit sequence succeeds, obtain a first information bit sequence based on the third information bit sequence, and stop decoding, where the first information bit sequence is the third information bit sequence or the first information bit sequence is a sequence obtained after polar coding is performed on the third information bit sequence.

The processing unit 702 is further configured to: if the check on the third information bit sequence fails and i is less than x, set i=i+1, and perform the step of decoding the to-be-decoded sequence based on an $i^{th}$ probability distribution value in a probability distribution value set P and a frozen bit sequence corresponding to the $i^{th}$ probability distribution value, to obtain a third bit sequence corresponding to the $i^{th}$ probability distribution value, where x is a quantity of probability distribution values included in the probability distribution value set P.

The processing unit 702 is further configured to: if the check on the third information bit sequence fails and i is equal to x: stop decoding; or obtain a fourth information bit sequence based on a target information bit sequence, and stop decoding, where the target information bit sequence is one of x third information bit sequences corresponding to the probability distribution value set P, and the fourth information bit sequence is the target information bit sequence or the fourth information bit sequence is a sequence obtained after polar coding is performed on the target information bit sequence.

In a possible implementation, if the $i^{th}$ probability distribution value is not equiprobable distribution, the first information bit sequence is the sequence obtained after polar coding is performed on the third information bit sequence; or if the $i^{th}$ probability distribution value is equiprobable distribution, the first information bit sequence is the third information bit sequence.

In a possible implementation, if $|P_{i,r}-0.5| \le \in$, the $i^{th}$ probability distribution value is equiprobable distribution, where $\in$ is a preset value, and $P_{i,r}$ is the $i^{th}$ probability distribution value.

In a possible implementation, a decoding order of probability distribution values in the probability distribution value set P is determined based on information entropies corresponding to the probability distribution values in the probability distribution value set P.

In a possible implementation, an information entropy corresponding to the $i^{th}$ probability distribution value is greater than or equal to an information entropy corresponding to an $(i+1)^{th}$ probability distribution value.

In a possible implementation, a decoding order of probability distribution values in the probability distribution value set P is determined based on historical probability distribution values of a transmitting end.

In a possible implementation, the communications unit 701 is configured to receive a probability distribution reference value range or a probability distribution reference value sent by a first communications device every N information bit sequences, where N is an integer greater than 1. A decoding order of probability distribution values in the probability distribution value set P is determined based on the probability distribution reference value range or the probability distribution reference value.

In a possible implementation, the target information bit sequence is a third information bit sequence corresponding to equiprobable distribution in the probability distribution value set P.

In a possible implementation, check bit locations in the third bit sequence are bit locations corresponding to rows whose sums are 1 in G(a), G(a) is a matrix including rows and columns in a set a in a polar matrix G, the polar matrix G is a polar matrix used for the polar coding, the set a is an information bit set, and the information bit set includes information bit locations and the check bit locations in the third bit sequence.

In a possible implementation, at least one of the check bits is located in the bits included in the third information bit sequence.

In a possible implementation, one probability distribution value in the probability distribution value set P corresponds to one frozen bit sequence mapping manner, and the processing unit 702 is further configured to determine, based on a frozen bit sequence mapping manner corresponding to the $i^{th}$ probability distribution value, the frozen bit sequence corresponding to the $i^{th}$ probability distribution value.

In a possible implementation, the frozen bit sequence corresponding to the $i^{th}$ probability distribution value is determined based on a basic sequence corresponding to the probability distribution value, and the basic sequence is determined based on the quantity of probability distribution values included in the probability distribution value set P.

In a possible implementation, the frozen bit sequence corresponding to the $i^{th}$ probability distribution value is determined based on an m-sequence, a Gold sequence, or a pseudo-random sequence corresponding to the probability distribution value.

In a possible implementation, the check bits include cyclic redundancy check CRC bits and/or parity check PC bits.

Figure 8:
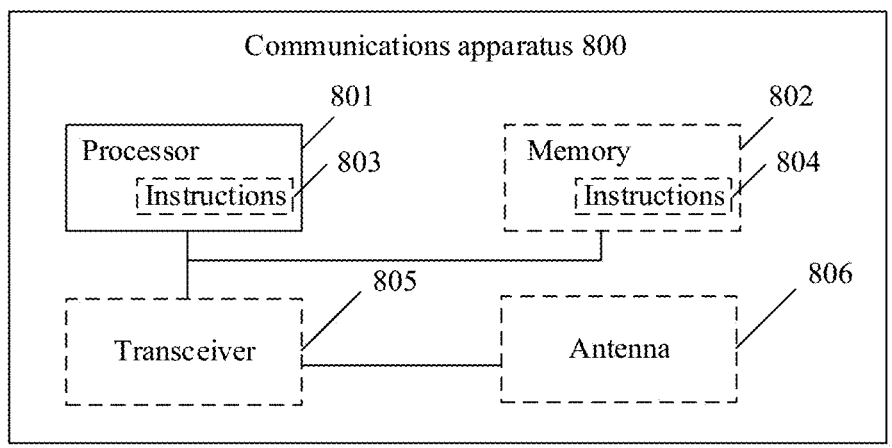
FIG. 8 is a schematic diagram of a structure of another communications apparatus according to an embodiment of this application.

FIG. 8 is a schematic diagram of a structure of a communications apparatus. The communications apparatus 800 may be the first communications device in the foregoing method embodiment, may be the second communications device in the foregoing method embodiment, may be a chip, a chip system, a processor, or the like that supports the first communications device in implementing the foregoing method, may be a chip, a chip system, a processor, or the like that supports the second communications device in implementing the foregoing method, or may be a chip, a chip system, a processor, or the like that supports a server in implementing the foregoing method. The communications apparatus may be configured to implement the method described in the foregoing method embodiment. For details, refer to the descriptions in the foregoing method embodiment.

The communications apparatus 800 may include one or more processors 801. The processor 801 may be a general-purpose processor, a dedicated processor, or the like. For example, the processor 801 may be a baseband processor or a central processing unit. The baseband processor may be configured to process a communication protocol and communication data. The central processing unit may be configured to: control a communications apparatus (for example, a base station, a baseband chip, a terminal, a terminal chip, a DU, or a CU), execute a software program, and process data of the software program.

Optionally, the communications apparatus 800 may include one or more memories 802. The memory 802 may store instructions 804, and the instructions may be run on the processor 801, to enable the communications apparatus 800 to perform the method described in the foregoing method embodiment. Optionally, the memory 802 may further store data. The processor 801 and the memory 802 may be separately disposed, or may be integrated together.

Optionally, the communications apparatus 800 may further include a transceiver 805 and an antenna 806. The transceiver 805 may be referred to as a transceiver unit, a transceiver machine, a transceiver circuit, or the like, and is configured to implement a sending/receiving function. The transceiver 805 may include a receiver and a transmitter. The receiver may be referred to as a receiver machine, a receiver circuit, or the like, and is configured to implement a receiving function. The transmitter may be referred to as a transmitter machine, a transmitter circuit, or the like, and is configured to implement a sending function. The processing unit 702 shown in FIG. 7 may be the processor 801. The communications unit 701 may be the transceiver 805.

The communications apparatus 800 is the first communications device: The processor 801 is configured to perform a data processing operation of the first communications device in the foregoing method embodiment. The transceiver 805 is configured to perform a data sending/receiving operation of the first communications device in the foregoing method embodiment. For example, the transceiver 805 may be configured to perform a data sending/receiving operation of the first communications device in FIG. 3, FIG. 4, or FIG. 6. For example, the transceiver 805 may send a modulation symbol. The processor 801 may be configured to perform a data processing operation of the first communications device in FIG. 3, FIG. 4, or FIG. 6. For example, the processor 801 may perform step 301 to step 305 and step 307 in FIG. 3. Alternatively, the processor 801 may perform step 401 to step 407 and step 409 in FIG. 4. Alternatively, the processor 801 may perform step 601 to step 605, step 607, and step 608 in FIG. 6.

The communications apparatus 800 is the second communications device: The processor 801 is configured to perform a data processing operation of the second communications device in the foregoing method embodiment. The transceiver 805 is configured to perform a data sending/receiving operation of the second communications device in the foregoing method embodiment. For example, the transceiver 805 may be configured to perform a data sending/receiving operation of the second communications device in FIG. 3, FIG. 4, or FIG. 6. For example, the transceiver 805 may receive a modulation symbol. The processor 801 may be configured to perform a data processing operation of the second communications device in FIG. 3, FIG. 4, or FIG. 6. For example, the processor 801 may perform step 309 to step 315 in FIG. 3. Alternatively, the processor 801 may perform step 411 to step 418 in FIG. 4. Alternatively, the processor 801 may perform step 610 to step 616 in FIG. 6.

In another possible design, the processor 801 may include a transceiver configured to implement a receiving and sending function. For example, the transceiver may be transceiver circuits, interfaces, or interface circuits. The transceiver circuits, the interfaces, or the interface circuits configured to implement the receiving and sending function may be separated, or may be integrated together. The transceiver circuit, the interface, or the interface circuit may be configured to read/write code/data. Alternatively, the transceiver circuit, the interface, or the interface circuit may be configured to transmit or transfer a signal.

In still another possible design, optionally, the processor 801 may store instructions 803, and the instructions 803 are run on the processor 801, to enable the communications apparatus 800 to perform the method described in the foregoing method embodiment. The instructions 803 may be built into the processor 801. In this case, the processor 801 may be implemented by using hardware.

In still another possible design, the communications apparatus 800 may include a circuit. The circuit may implement a sending, receiving, or communication function in the foregoing method embodiment. The processor and the transceiver described in this embodiment of this application may be implemented on an integrated circuit (integrated circuit, IC), an analog IC, a radio frequency integrated circuit RFIC, a hybrid signal IC, an application-specific integrated circuit (application specific integrated circuit, ASIC), a printed circuit board (printed circuit board, PCB), an electronic device, or the like. The processor and the transceiver may alternatively be manufactured by using various IC technologies, for example, a complementary metal oxide semiconductor (complementary metal oxide semiconductor, CMOS), an N-channel metal oxide semiconductor (nMetal-oxide-semiconductor, NMOS), a p-channel metal oxide semiconductor (positive channel metal oxide semiconductor, PMOS), a bipolar junction transistor (Bipolar Junction Transistor, BJT), a bipolar CMOS (BiCMOS), silicon germanium (SiGe), and gallium arsenide (GaAs).

The communications apparatus described in the foregoing embodiment may be the first communications device or the second communications device. However, a scope of the communications apparatus described in embodiments of this application is not limited thereto, and a structure of the communications apparatus may not be limited by FIG. 8. The communications apparatus may be an independent device or may be a part of a relatively large device. For example, the communications apparatus may be:

(1) an independent integrated circuit IC, a chip, or a chip system or subsystem;
(2) a set that has one or more ICs, where optionally, the IC set may alternatively include a storage component configured to store data and instructions;
(3) an ASIC, for example, a modem (MSM);
(4) a module that can be embedded in another device;
(5) a receiver, a terminal, an intelligent terminal, a cellular phone, a wireless device, a handheld device, a mobile unit, a vehicle-mounted device, a network device, a cloud device, an artificial intelligence device, or the like; or
(6) another device, or the like.

Figure 9:
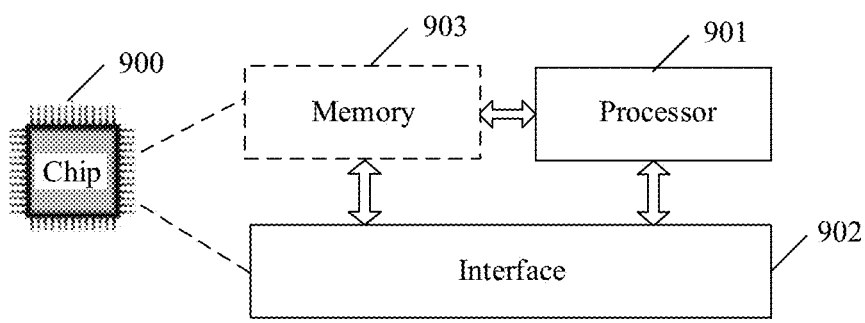
FIG. 9 is a schematic diagram of a structure of a chip according to an embodiment of this application.

For a case in which the communications apparatus may be a chip or a chip system, refer to a schematic diagram of a structure of a chip in FIG. 9. A chip 900 shown in FIG. 9 includes a processor 901 and an interface 902. Optionally, the chip 900 may further include a memory 903. There may be one or more processors 901 and a plurality of interfaces 902.

In a design, for a case in which the chip is configured to implement functions of the first communications device in embodiments of this application, details are as follows:

The interface 902 is configured to receive or output a signal. For example, the interface 902 may be configured to perform a signal receiving or output operation of the first communications device in FIG. 3, FIG. 4, or FIG. 6. For example, the interface 902 may output a second bit sequence and output a modulation symbol.

The processor 901 is configured to perform a data processing operation of the first communications device. For example, the processor 901 may be configured to perform a data processing operation of the first communications device in FIG. 3, FIG. 4, or FIG. 6. For example, the processor 901 may perform step 301 to step 305 and step 307 in FIG. 3. Alternatively, the processor 901 may perform step 401 to step 407 and step 409 in FIG. 4. Alternatively, the processor 901 may perform step 601 to step 605, step 607, and step 608 in FIG. 6.

In another design, for a case in which the chip is configured to implement functions of the second communications device in embodiments of this application, details are as follows:

The interface 902 is configured to receive or output a signal. For example, the interface 902 may be configured to perform a signal receiving or output operation of the second communications device in FIG. 3, FIG. 4, or FIG. 6. For example, the interface 902 may receive a modulation symbol.

The processor 901 is configured to perform a data processing operation of the second communications device. For example, the processor 901 may be configured to perform a data processing operation of the second communications device in FIG. 3, FIG. 4, or FIG. 6. For example, the processor 901 may perform step 309 to step 315 in FIG. 3. Alternatively, the processor 901 may perform step 411 to step 418 in FIG. 4. Alternatively, the processor 901 may perform step 610 to step 616 in FIG. 6.

It may be understood that, in some scenarios, some optional features in embodiments of this application may be independently implemented without depending on another feature, for example, a solution on which the optional features are currently based, to resolve a corresponding technical problem and achieve a corresponding effect. Alternatively, in some scenarios, the optional features may be combined with other features based on requirements. Correspondingly, the communications apparatus provided in embodiments of this application may also correspondingly implement these features or functions. Details are not described herein.

It should be noted that the processor in embodiments of this application may be an integrated circuit chip, and has a signal processing capability. In an implementation process, the steps in the foregoing method embodiments may be implemented by using an integrated logic circuit of hardware in the processor, or instructions in a form of software. The foregoing processor may be a general-purpose processor, a digital signal processor (digital signal processor, DSP), an application-specific integrated circuit (application specific integrated circuit, ASIC), a field programmable gate array (field programmable gate array, FPGA) or another programmable logic device, a discrete gate or transistor logic device, or a discrete hardware component.

It may be understood that the memory in embodiments of this application may be a volatile memory or a nonvolatile memory, or may include both a volatile memory and a nonvolatile memory. The nonvolatile memory may be a read-only memory (read-only memory, ROM), a programmable read-only memory (programmable ROM, PROM), an erasable programmable read-only memory (erasable PROM, EPROM), an electrically erasable programmable read-only memory (electrically EPROM, EEPROM), or a flash memory. The volatile memory may be a random access memory (random access memory, RAM), used as an external cache. Through example but not limitative description, many forms of RAMs may be used, for example, a static random access memory (static RAM, SRAM), a dynamic random access memory (dynamic RAM, DRAM), a synchronous dynamic random access memory (synchronous DRAM, SDRAM), a double data rate synchronous dynamic random access memory (double data rate SDRAM, DDR SDRAM), an enhanced synchronous dynamic random access memory (enhanced SDRAM, ESDRAM), a synchronous link dynamic random access memory (synchlink DRAM, SLDRAM), and a direct rambus random access memory (direct rambus RAM, DR RAM). It should be noted that the memory in the system and the method described in this specification is intended to include but is not limited to these memories or any memory of another proper type.

This application further provides a computer-readable medium. The storage medium stores a computer program or instructions. When the computer program is or the instructions are executed by a communications apparatus, a function in any one of the foregoing method embodiments is implemented.

This application further provides a computer program product including instructions. When a computer reads and executes the computer program product, the computer is enabled to implement a function in any one of the foregoing method embodiments.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer instructions are loaded and executed on a computer, all or some of the procedures or functions according to embodiments of this application are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (digital subscriber line, DSL)) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium (for example, a high-density digital video disc (digital video disc, DVD)), a semiconductor medium (for example, a solid state disk (solid state disk, SSD)), or the like.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method comprising:
   obtaining a first information bit sequence;
   determining a first frozen bit sequence based on a probability distribution value $P_1$ of the first information bit sequence;
   determining a check bit sequence based on a second information bit sequence, wherein the second information bit sequence is the first information bit sequence or a sequence obtained after a pre-transformation operation is performed on the first information bit sequence;
   obtaining a first bit sequence based on the second information bit sequence, the check bit sequence, and the first frozen bit sequence, wherein the first bit sequence comprises bits in the second information bit sequence, bits in the check bit sequence, and bits in the first frozen bit sequence;
   performing polar coding on the first bit sequence to obtain a second bit sequence; and
   outputting the second bit sequence.

2. The method according to claim 1, wherein
if the probability distribution value $P_1$ is not equiprobable distribution, the second information bit sequence is the sequence obtained after the pre-transformation operation is performed on the first information bit sequence; or
if the probability distribution value $P_1$ is equiprobable distribution, the second information bit sequence is the first information bit sequence.

3. The method according to claim 2, wherein if $|P_1 - 0.5| \leq \in$, the probability distribution value $P_1$ is equiprobable distribution, wherein $\in$ is a preset value.

4. The method according to claim 1, wherein check bit locations in the first bit sequence are bit locations corresponding to rows whose sums are 1 in G(a), G(a) is a matrix comprising rows and columns in a set a in a polar matrix G for the polar coding, the set a is an information bit set comprising information bit locations and the check bit locations in the first bit sequence.

5. The method according to claim 1, wherein at least one check bit in the check bit sequence is located in the bits comprised in the second information bit sequence.

6. The method according to claim 1, wherein the determining a first frozen bit sequence based on a probability distribution value $P_1$ of the first information bit sequence comprises:
selecting a probability distribution value $P_0$ that is closest to the probability distribution value $P_1$ in a probability distribution value set P, wherein one probability distribution value in the probability distribution value set P corresponds to one frozen bit sequence mapping manner; and
determining the first frozen bit sequence based on a frozen bit sequence mapping manner corresponding to the probability distribution value $P_0$.

7. The method according to claim 6, wherein the first frozen bit sequence is determined based on a basic sequence corresponding to the probability distribution value $P_0$, and the basic sequence is determined based on a quantity of probability distribution values comprised in the probability distribution value set P.

8. The method according to claim 6, wherein the first frozen bit sequence is determined based on one of an m-sequence, a Gold sequence, or a pseudo-random sequence corresponding to the probability distribution value $P_0$.

9. The method according to claim 1, wherein the method further comprises:
sending a probability distribution reference value range or a probability distribution reference value to a second communications device once every N information bit sequences, wherein N is an integer greater than 1.

10. The method according to claim 1, wherein the check bit sequence comprise at least one of cyclic redundancy check (CRC) bits or parity check PC bits.

11. A method comprising:
step 1: obtaining a sequence to be decoded;
step 2: setting i=1;
step 3: decoding the sequence based on an $i^{th}$ probability distribution value in a probability distribution value set P and a frozen bit sequence corresponding to the $i^{th}$ probability distribution value, to obtain a bit sequence corresponding to the $i^{th}$ probability distribution value, wherein the bit sequence comprises bits in an information bit sequence, check bits, and bits in the frozen bit sequence corresponding to the $i^{th}$ probability distribution value;
step 4: checking the information bit sequence;
step 5: if the checking the information bit sequence succeeds, obtaining a first information bit sequence based on the information bit sequence, and stopping decoding, wherein the first information bit sequence is the information bit sequence or the first information bit sequence is a sequence obtained after polar coding is performed on the information bit sequence;
step 6: if the checking the information bit sequence fails and i is less than x, setting i=i+1, and returning to step 3, wherein x is a quantity of probability distribution values comprised in the probability distribution value set P; and
step 7: if the checking the information bit sequence fails and i is equal to x:
stopping decoding; or
obtaining another information bit sequence based on a target information bit sequence, and stopping decoding, wherein the target information bit sequence is one of x information bit sequences corresponding to the probability distribution value set P, and the another information bit sequence is the target information bit sequence or a sequence obtained after polar coding is performed on the target information bit sequence.

12. The method according to claim 11, wherein
if the $i^{th}$ probability distribution value is not equiprobable distribution, the first information bit sequence is the sequence obtained after polar coding is performed on the information bit sequence; or
if the $i^{th}$ probability distribution value is equiprobable distribution, the first information bit sequence is the information bit sequence.

13. The method according to claim 12, wherein if $|P_{i,r} - 0.5| \leq \in$, the $i^{th}$ probability distribution value is equiprobable distribution, wherein E is a preset value, and $P_{i,r}$ is the $i^{th}$ probability distribution value.

14. The method according to claim 11, wherein a decoding order of probability distribution values in the probability distribution value set P is determined based on information entropies corresponding to the probability distribution values in the probability distribution value set P.

15. The method according to claim 14, wherein an information entropy corresponding to the $i^{th}$ probability distribution value is greater than or equal to an information entropy corresponding to an $(i+1)^{th}$ probability distribution value.

16. The method according to claim 11, wherein a decoding order of probability distribution values in the probability distribution value set P is determined based on historical probability distribution values of a transmitting end.

17. The method according to claim 11, wherein the method further comprises:
receiving a probability distribution reference value range or a probability distribution reference value sent by a first communications device every N information bit sequences, wherein N is an integer greater than 1, wherein
a decoding order of probability distribution values in the probability distribution value set P is determined based on the probability distribution reference value range or the probability distribution reference value.

18. The method according to claim 11, wherein the target information bit sequence is a information bit sequence corresponding to equiprobable distribution in the probability distribution value set P.

19. The method according to claim 18, wherein check bit locations in a bit sequence are bit locations corresponding to rows whose sums are 1 in G(a), G(a) is a matrix comprising rows and columns in a set a in a polar matrix G for the polar coding, the set a is an information bit set comprising information bit locations and the check bit locations in the bit sequence.

20. The method according to claim 19, wherein at least one of the check bits is located in the bits comprised in the information bit sequence.

* * * * *